United States Patent
Cho et al.

(10) Patent No.: US 10,673,996 B2
(45) Date of Patent: *Jun. 2, 2020

(54) MODULAR ELECTRONIC DEVICE

(71) Applicant: Google LLC, Mountain View, CA (US)

(72) Inventors: Peter Cho, San Francisco, CA (US); Rafael Camargo, Monte Sereno, CA (US); Jason Wong, Millbrae, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,746

(22) Filed: Sep. 12, 2018

(65) Prior Publication Data
US 2019/0014200 A1    Jan. 10, 2019

Related U.S. Application Data

(63) Continuation of application No. 15/343,858, filed on Nov. 4, 2016, now Pat. No. 10,084,896.

(Continued)

(51) Int. Cl.
*H04M 1/02* (2006.01)
*H05K 5/02* (2006.01)
*H04B 1/3827* (2015.01)
*H04M 1/725* (2006.01)
*G05B 11/01* (2006.01)
(Continued)

(52) U.S. Cl.
CPC ........... *H04M 1/0254* (2013.01); *G05B 11/01* (2013.01); *G06F 1/1626* (2013.01); *G06F 1/1643* (2013.01); *G06F 1/1656* (2013.01); *G06F 1/1658* (2013.01); *H04B 1/3833* (2013.01); *H04M 1/72575* (2013.01); *H05K 5/0017* (2013.01); *H05K 5/0295* (2013.01); *G06F 3/0412* (2013.01); *H04M 2250/22* (2013.01)

(58) Field of Classification Search
CPC .. H05K 5/0017; H05K 5/0086; H05K 5/0256; H04M 1/0254; H04M 1/72575; H04M 1/0249; H04M 1/0252; H04M 1/0274; H04B 1/3833; H04B 1/38
See application file for complete search history.

(56) References Cited

U.S. PATENT DOCUMENTS

| 5,508,720 A | 4/1996 | DiSanto et al. |
| 5,598,487 A | 1/1997 | Hacker et al. |

(Continued)

OTHER PUBLICATIONS

Lomas, "Pressy is the Customisable Hardware Button Your Android Phone has been Waiting For", https://techcrunch/com/2013/08/29/pressy/, retrieved on Oct. 19, 2016, 5 pages.

*Primary Examiner* — Ryan Johnson
(74) *Attorney, Agent, or Firm* — Dority & Manning, P.A.

(57) ABSTRACT

One example modular electronic device of the present disclosure includes a frame and a plurality of electronic modules which are respectively removably received at a plurality of bays formed by the frame. The modular electronic device can enable a user to directly operate, interact with, remove, or otherwise manipulate the electronic modules without requiring the user to navigate through or otherwise interact with a graphical user interface. In particular, the modular electronic device can enable the user to operate, remove, or otherwise interact with the electronic modules by simply touching or pressing a particular electronic module.

42 Claims, 13 Drawing Sheets

Related U.S. Application Data

(60) Provisional application No. 62/251,514, filed on Nov. 5, 2015.

(51) Int. Cl.
*G06F 1/16* (2006.01)
*H05K 5/00* (2006.01)
*G06F 3/041* (2006.01)

(56) References Cited

U.S. PATENT DOCUMENTS

| | | | |
|---|---|---|---|
| 5,818,691 A | 10/1998 | McMahan et al. | |
| 5,832,371 A | 11/1998 | Thornton | |
| 5,918,189 A | 6/1999 | Kivela | |
| 6,219,732 B1 | 4/2001 | Henrie et al. | |
| 6,640,113 B1 | 10/2003 | Shim et al. | |
| 6,697,251 B1 | 2/2004 | Aisenberg | |
| 7,068,499 B2 | 6/2006 | Aisenberg | |
| 7,239,509 B1 | 7/2007 | Roeske | |
| 7,436,655 B2 | 10/2008 | Homer et al. | |
| 7,882,382 B2 | 2/2011 | Aksamit et al. | |
| 7,951,007 B2 | 5/2011 | Wolinsky | |
| 8,149,224 B1 | 4/2012 | Kuo et al. | |
| 8,226,442 B2 | 7/2012 | Uusimaki et al. | |
| 8,340,795 B2 | 12/2012 | Sherman | |
| 8,391,921 B2 | 3/2013 | Moran et al. | |
| 8,493,282 B2 | 7/2013 | Moran | |
| 8,509,848 B1 | 8/2013 | Cole | |
| 8,626,149 B2 * | 1/2014 | Steenstra | H04M 1/24 455/423 |
| 8,842,429 B2 | 9/2014 | Ahn et al. | |
| 8,868,075 B2 | 10/2014 | Sherman et al. | |
| 8,892,164 B2 | 11/2014 | Sherman | |
| 8,924,609 B2 | 12/2014 | Fowler | |
| 10,084,896 B1 * | 9/2018 | Cho | H05K 5/0295 |
| 2002/0146112 A1 | 10/2002 | Larson et al. | |
| 2005/0107046 A1 | 5/2005 | Desbarats et al. | |
| 2006/0143352 A1 | 6/2006 | Park | |
| 2006/0273174 A1 | 12/2006 | Laitinen et al. | |
| 2009/0128504 A1 | 5/2009 | Smith | |
| 2013/0016040 A1 | 1/2013 | Ahn et al. | |
| 2014/0025224 A1 | 1/2014 | Wong et al. | |
| 2014/0028635 A1 | 1/2014 | Krah | |
| 2015/0033167 A1 | 1/2015 | Helmes et al. | |
| 2016/0353264 A1 | 12/2016 | Lim et al. | |

* cited by examiner

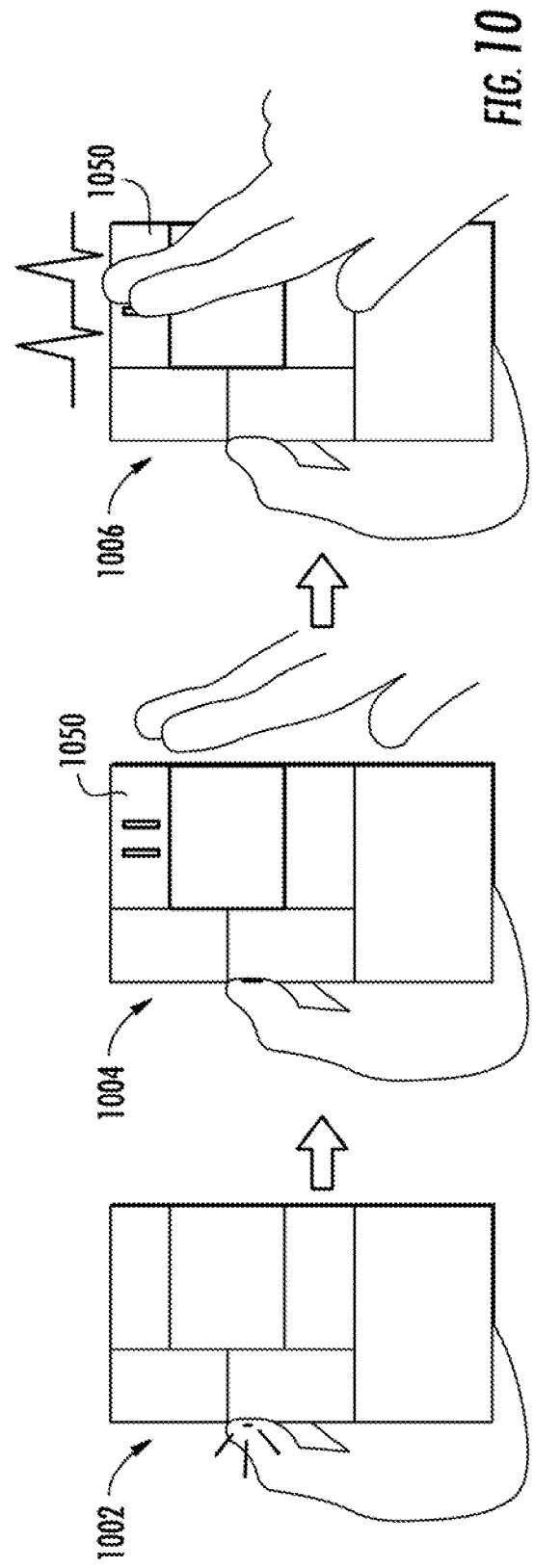
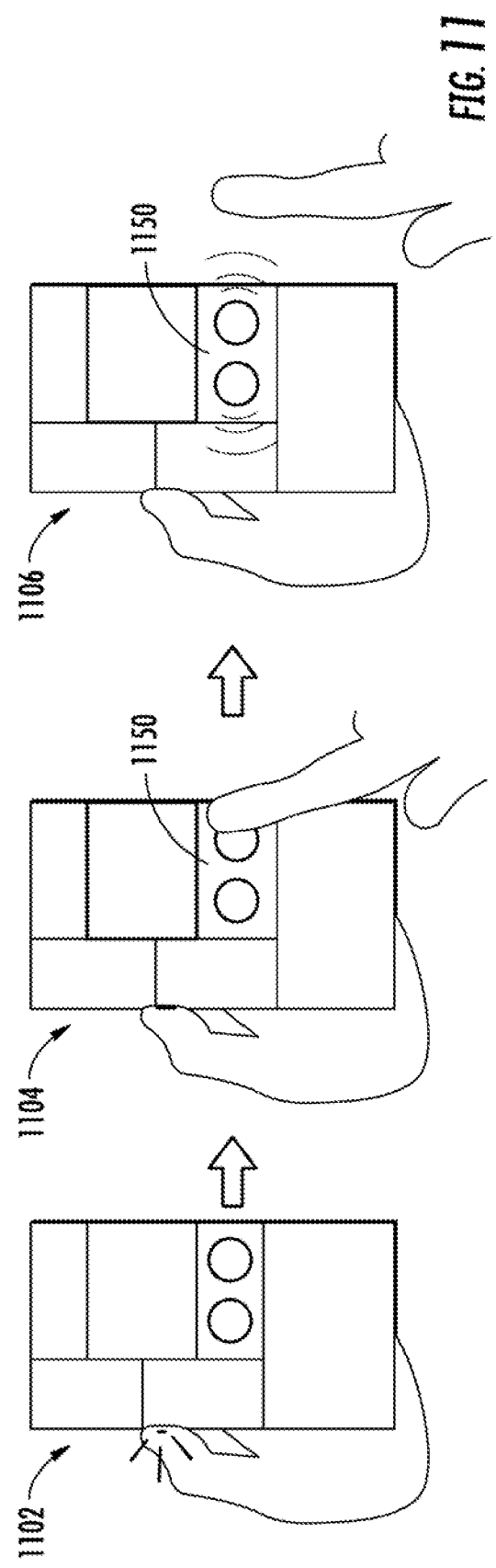

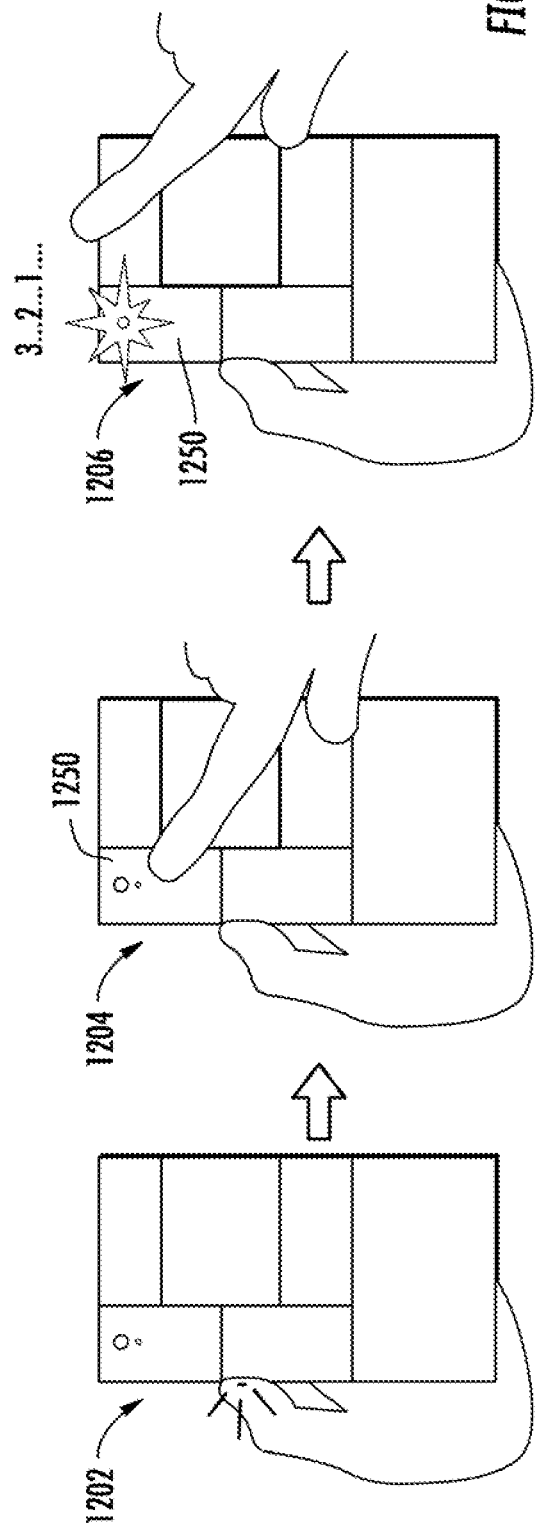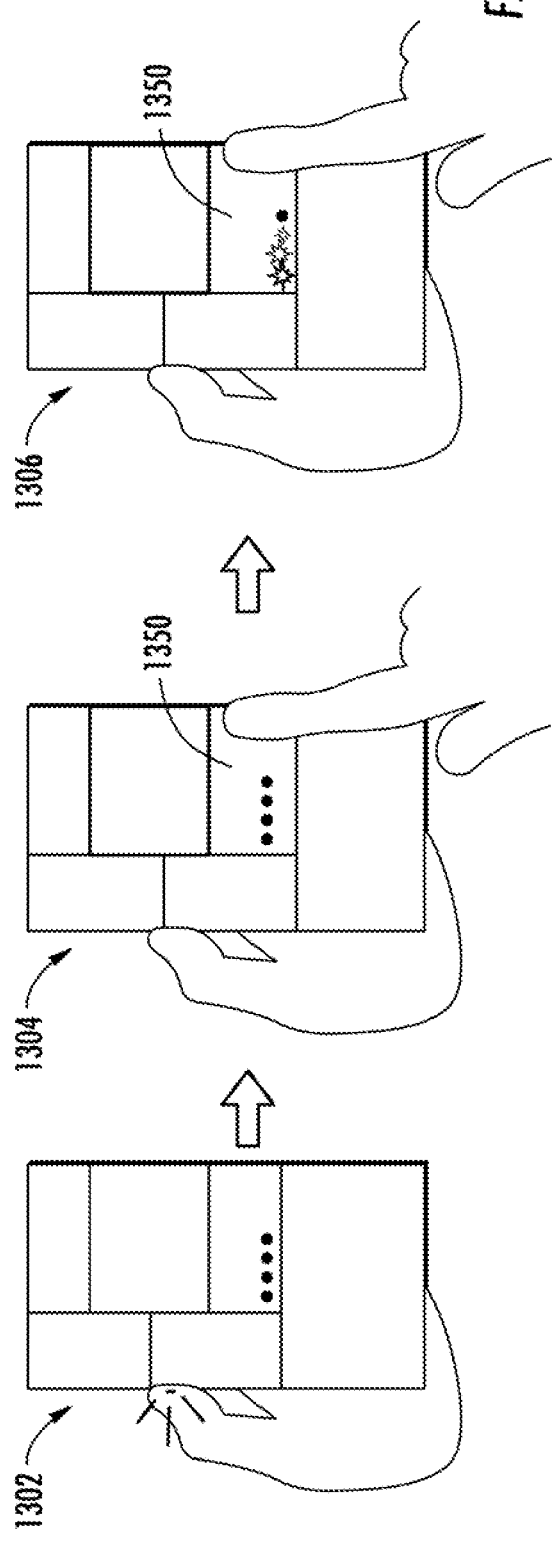

MODULAR ELECTRONIC DEVICE

PRIORITY CLAIM

The present application is a continuation of U.S. application Ser. No. 15/343,858 having a filing date of Nov. 4, 2016, which claims the benefit of U.S. Provisional Application Ser. No. 62/251,514 filed Nov. 5, 2015. Applicant claims priority to and the benefit of each of such applications.

FIELD

The present disclosure relates generally to modular electronic devices and, more particularly, to modular electronic devices and associated methods of operation that provide enhanced control, operation, and/or removal of electronic modules via user touch-based interactions.

BACKGROUND

In most hardware platforms, the user interacts with the system through a centralized interface. As the interactions become more complex, the centralized interface is usually a screen-based graphical user interface. Thus, as physical components and hardware peripherals are added to the system, the user must interact with the functionality that such peripheral components offer via the centralized interface (e.g., via the screen-based user interface). As such, the user's interaction with the peripheral component is inherently disconnected from the hardware itself. Such inherent disconnect adds mental overhead to the control process and creates confusion for the user. This becomes especially cumbersome when users are required to go through digital interfaces nested in layers of screens, bundled in an application, which itself may be hidden among many different available applications. This added friction limits use opportunities of the peripheral component and reduces the value that the hardware can provide.

As one example, certain mobile devices can permit a hardware module to be connected to the mobile device. However, to enable operation of the hardware module, the user is typically required to: unlock the mobile device; navigate through a menu of various available applications; locate the application associated with the hardware module; select the application and wait for it to load; and then navigate through various interfaces of the application to enable the functionality of the hardware module. Such process reduces both the efficiency and desirability of using the hardware module.

Furthermore, in hardware platforms that include interchangeable modules, the modules must be easily removable and swapped. However, the locking mechanisms that hold components in place must provide enough force so that the modules survive reliability and drop tests. As such, these locking mechanisms are typically purely mechanical in nature. Unfortunately, this means as users remove modules, the software may not have sufficient time to write module data to memory and power down gracefully. As an example, if the user removes a hardware module without "ejecting" it in software first, they are typically provided with an error message.

To solve for such issue, certain systems require the user to indicate that the user wants to eject a module via a screen-based user interface before they remove it. However, as noted above, interacting with the screen-based interface to control a hardware module is inherently disconnected from the physical hardware itself, adding to mental overhead. Therefore, use of screen-based interfaces to control hardware modules can lead to discoverability and usability issues.

SUMMARY

Aspects and advantages of embodiments of the present disclosure will be set forth in part in the following description, or may be learned from the description, or may be learned through practice of the embodiments.

One example aspect of the present disclosure is directed to a modular electronic device. The modular electronic device includes a plurality of electronic modules. The modular electronic device includes at least one input sensor that provides data indicative of a location of a touch of the modular electronic device by a user. The modular electronic device includes a frame that forms a plurality of bays. The frame is adapted to respectively receive the plurality of electronic modules at the plurality of bays. Each of the plurality of electronic modules is selectively removable from the respective bay at which it is received. The frame includes a frame controller. The frame includes at least one data connection interface that communicatively couples the plurality of electronic modules to the frame controller. The frame controller receives the data indicative of the location of the touch of the modular electronic device from the at least one input sensor; and, in response to the touch: identifies, based at least in part on the data received from the at least one input sensor, which of plurality of electronic modules corresponds to the location of the touch of the modular electronic device by the user; and enables removal of the identified electronic module from the corresponding bay.

Another example aspect of the present disclosure is directed to a method of operating a modular electronic device that includes a plurality of electronic modules and a frame that forms a plurality of bays. The frame is adapted to respectively receive the plurality of electronic modules at the plurality of bays. Each of the plurality of electronic modules is selectively removable from the respective bay at which it is received. The method includes receiving, by a frame controller included in the frame, data from at least one input sensor of the modular electronic device. The data is indicative of a location of a touch of the modular electronic device by a user. The method includes, in response to the touch, identifying, by the frame controller based at least in part on the data received from the at least one input sensor, which of plurality of electronic modules corresponds to the location of the touch of the modular electronic device by the user. The method includes, in response to the touch, enabling, by the frame controller, removal of the identified electronic module from the corresponding bay.

Another example aspect of the present disclosure is directed to a frame of a modular electronic device. The frame includes a plurality of bays adapted to respectively receive a plurality of electronic modules. Each of the plurality of electronic modules is selectively removable from the respective bay at which it is received. The frame includes at least one data connection interface adapted to communicatively couple the plurality of electronic modules to a frame controller. The frame includes the frame controller. The frame controller includes at least one non-transitory computer readable medium and at least one processor that executes a set of instructions stored by the at least one non-transitory computer-readable medium to cause the frame controller to: receive data indicative of a location of a touch of the modular electronic device from at least one input sensor of the modular electronic device; and in response to the touch: identify, based at least in part on the data received from the at least one input sensor, which of plurality of electronic modules corresponds to the location of the touch of the modular electronic device by the user; and enable removal of the identified electronic module from the corresponding bay.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 10 depicts operation of an example modular electronic device to enable a sensor module according to example embodiments of the present disclosure.

FIG. 11 depicts operation of an example modular electronic device to enable a speaker module according to example embodiments of the present disclosure.

FIG. 12 depicts operation of an example modular electronic device to enable a camera module according to example embodiments of the present disclosure.

FIG. 13 depicts operation of an example modular electronic device to enable a battery life indicator module according to example embodiments of the present disclosure.

DETAILED DESCRIPTION

Figure 1B:
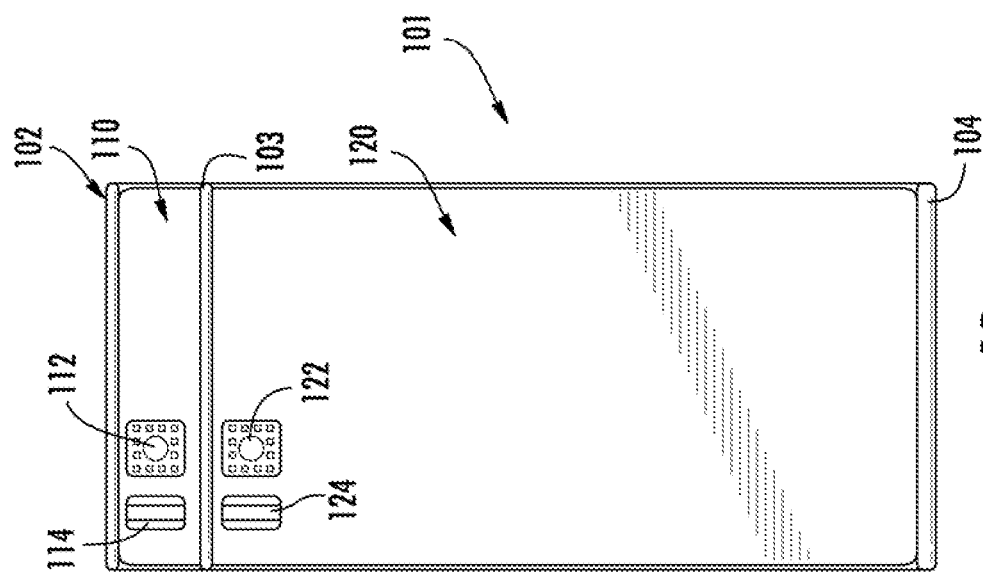
FIG. 1B depicts a front side of an example frame of a modular electronic device according to example embodiments of the present disclosure.

Generally, the present disclosure is directed to modular electronic devices and associated methods of operation. One example modular electronic device of the present disclosure includes a frame and a plurality of electronic modules which are respectively removably received at a plurality of bays formed by the frame. The modular electronic device can enable a user to directly operate, interact with, remove, or otherwise manipulate the electronic modules without requiring the user to navigate through or otherwise interact with a graphical user interface. In particular, as an example, the modular electronic device can enable the user to operate, remove, or otherwise interact with the electronic modules by simply touching or pressing a particular electronic module.

As one example, the modular electronic device can enable the user to operate or otherwise utilize the functionality of a particular electronic module by simply pressing or otherwise touching the particular module. In particular, the modular electronic device can recognize that the user has touched a location that corresponds to a particular electronic module and, in response, automatically call a function supported by the electronic module. For example, the electronic module may include a component that interacts with the physical world (e.g., by collecting data about a physical condition or by outputting some sound, imagery, light, etc.). In response to the user touching the particular module, the modular electronic device can automatically execute a set of instructions which enable the component of the electronic module to operate and interact with the physical world (e.g., collect the data or output the sound, imagery, light, etc.).

As another example, the modular electronic device can enable the removal of a particular electronic module in response to a user pressing or otherwise touching a particular module. For example, in response to a user touch of a particular electronic module, the modular electronic device can physically eject the touched electronic module from the bay of the device in which such module is received. In particular, as an example, each bay of the frame and/or each electronic module may have a latch that is controllable to selectively secure the corresponding module in the corresponding bay. In some implementations, each bay of the frame and/or each electronic module may have an ejector that is controllable to selectively eject the corresponding module from the corresponding bay. In other implementations, the ejector continuously applies repulsive forces to or between the module and/or frame so that the module is ejected unless the latch prevents ejection of the module. Thus, the latch and/or ejector of each pair of module and bay can be controlled to un-latch and/or eject the module from the bay in response to a touch of the particular module by the user.

According to another aspect of the present disclosure, in some implementations, the modular electronic device operatively responds to the user touch of an electronic module (e.g., by calling a function supported by the module or by enabling removal of the module) only when a secondary condition is satisfied at the time of the touch. For example, the secondary condition may require a button on the frame of the device to be pressed when the touch of the module occurs. Other secondary conditions can include requiring the modular electronic device to have a particular orientation when the touch occurs and/or requiring that the user also concurrently touches another location on the device (e.g., a front-facing display screen). In such fashion, incidental contact by the user with one of the modules does not trigger the operations of the present disclosure. Instead, in such implementations, only when the secondary condition is satisfied does the modular electronic device enable the user to operate, remove, or otherwise interact with the electronic modules by touching or pressing a particular electronic module.

In some implementations, the secondary condition requires a continuous user input to be satisfied, particularly for secondary conditions associated with removal and/or ejection of electronic modules. For example, a continuous user input can require that the user continuously perform an input action (e.g., press and hold a button or pull and hold a component of a switch of the frame away from the frame), rather than being satisfied by previous, but not continuous, user input, such as previously switching a toggle to a certain position. In such fashion, inadvertent operation or removal of electronic modules can be reduced, as the user is required to provide continuous input to trigger operation, ejection, or other activities associated with the module.

As noted above, one example modular electronic device of the present disclosure includes a frame. The frame can form or otherwise include a plurality of bays which are adapted to respectively receive a plurality of electronic modules. For example, the frame can have various ridges or other protrusions (e.g., a spine and two or more ribs) which form sidewalls of or otherwise define the bays. In some implementations, one module is receivable at each bay. In some implementations, each of the electronic modules has a footprint that is complementary to a size and a shape of the respective bay at which such electronic module is received.

The plurality of electronic modules can be selectively insertable and removable from the plurality of bays. The various electronic modules may have different functions and/or components and may be interchangeably swapped in and out of the frame. Thus, the modular electronic device allows the user to change the various modules of the modular electronic device to customize the device to various applications, environments, tasks, user tastes or styles, etc.

The frame of the modular electronic device can include a frame controller. In some implementations, the frame controller includes a processor and a non-transitory computer-readable medium that stores instructions to be executed by the processor to perform operations. The frame controller can control the basic operations of the modular electronic device and, in some implementations, implements aspects of the various methods disclosed herein.

The frame of the modular electronic device can also include at least one data connection interface that communicatively couples the plurality of electronic modules to the frame controller. As one example, the frame can include at least one data connection interface in each of the plurality of bays. The at least one data connection interface can provide bi-directional communications between the frame controller and the electronic module via one or more electrical, magnetic (e.g., inductive), or optical couplings between the interface and the corresponding module. As an example, the data connection interface of each bay can include a number of complementary pairs of prongs, pins, contacts, or the like to form a number of serial data connections or other forms of data connection.

According to another aspect of the present disclosure, the modular electronic device can also include at least one input sensor that provides data indicative of a touch of the modular electronic device by a user. In particular, the at least one input sensor can provide data indicative of a location of the touch of the modular electronic device by the user. In some implementations, the at least one input sensor is included in the frame. In other implementations, the at least one input sensor includes a plurality of input sensors respectively included in the plurality of electronic modules.

As one example, in some implementations, each electronic module can include at least one switch. The at least one switch in each module can be actuatable by a press of the corresponding electronic module toward the bay in which it is received. For example, each switch can be an electrical dome switch or other pressure sensitive switch. Thus, by pressing a particular electronic module toward the frame, the switch within such module is actuated and data indicative of the touch of such module can be transmitted to the frame controller (e.g., via the data connection interface).

As another example, in some implementations, the frame can include at least one input sensor positioned within each of the plurality of bays. For example, each input sensor can be a switch that is actuatable by a press of the electronic module received in the respective bay toward the frame. For example, each switch can be an electrical dome switch or other pressure sensitive switch. Thus, by pressing one of the electronic modules toward the frame, the corresponding switch within the bay is actuated and the touch of the module can be detected or otherwise recognized by the frame controller.

As another example, the at least one input sensor can include a plurality of capacitive sensors respectively positioned in the plurality of bays. For example, each of the electronic modules received within the frame can be grounded so that the frame is operable to detect a change in capacitance at a respective one of the plurality of capacitive sensors due to the touch of the electronic module. Other capacitive sensor arrangements can be used as well.

As yet another example, the at least one input sensor can include a RADAR system that sends, receives, and processes radio waves to determine the location of the touch of the modular electronic device by the user. Likewise, the at least one input sensor can include a computer vision system that processes imagery captured by a camera of the modular electronic device to determine the location of the touch of the modular electronic device by the user. As another example, the at least one input sensor can include an inertial system that analyzes a moment indicated by data from one or more gyroscopes or accelerometers of the modular electronic device to determine the location of the touch of the modular electronic device by the user.

Thus, the at least one input sensor of the frame can provide data indicative of a location of a touch of the modular electronic device by a user. The frame controller can receive such data from the at least one input sensor and can identify, based at least in part on such data, which of the plurality of electronic modules corresponds to the location of the touch by the user. In response to the touch, the frame controller can enable the operation of the identified electronic module, removal of the identified electronic module, or other actions with respect to the identified electronic module. Further, the actions enabled by the frame controller responsive to the touch can depend upon the status of various other conditions (e.g., whether the user is concurrently pressing a first frame button associated with module removal/ejection, or pressing a second frame button associated with automatic module application execution).

In some implementations, the frame controller maintains a module/bay mapping that respectively maps the plurality of electronic modules to the plurality of bays in which they are respectively received. For example, upon receipt of a particular module at a particular bay, the frame controller can identify the received module and associate such module with the corresponding bay in the module/bay mapping. Thereafter, when the frame controller receives the data that indicates the location of the touch by the user, the frame controller can determine which of the plurality of bays corresponds to the location of the touch. The frame controller can then consult the module/bay mapping to identify the electronic module received at the identified bay.

In some implementations, at least some of the electronic modules include a non-transitory computer-readable medium which stores instructions specific to utilization of the corresponding module. In such implementations, in response to a touch of a particular module for which operation of the module is the appropriate response, the frame controller can load, retrieve, or other access the instructions stored at the particular module. The frame controller can then execute the set of instructions to enable operation of the module (e.g., performance of one or more functions supported by the module). In other implementations, the set of instructions are implemented by a processing device contained within the particular module.

In one particular example of the present disclosure, if the electronic module identified as having been touched includes a data collection component that collects data about a physical condition, the frame controller can enable the identified electronic module to automatically collect the data about the physical condition in response to the touch of such electronic module. As examples, the data collection component can include a pulse monitor, an oxygen level monitor, a glucose monitor, a credit card reader, a camera, a microphone, and/or various other types of sensors that collect data about a physical condition.

As another particular example, if the electronic module identified as having been touched includes an output component that performs an output function, the frame controller can enable the identified electronic module to automatically perform the output function in response to the touch of such electronic module. As examples, the output component can include a speaker, a visual battery life indicator, a rear-facing display, a wireless communications interface (e.g., a wireless network radio), a flashlight, or various other components that output light, sound, or haptic feedback.

According to another aspect of the present disclosure, in some implementations, prior to ejecting and/or un-latching an electronic module to enable removal of the module, the frame controller can prepare the electronic module for removal. For example, the frame controller can store or cause to be stored at a non-volatile computer-readable medium one or more items of data associated with the electronic module and previously stored in a volatile computer-readable medium. The non-volatile computer-readable medium can be located within the frame or within the electronic module. As another example, prior to ejecting and/or un-latching the electronic module, the frame controller can eliminate a flow of power from a power source of the modular electronic device to the identified electronic module.

Thus, the modular electronic devices of the present disclosure can enable a user to operate, remove, or otherwise interact with various removably received electronic modules by simply touching or pressing a particular electronic module. Therefore, the user is not required to navigate through or otherwise interact with a graphical user interface. As such, the devices and methods described herein streamline modular interactivity and reduce the mental overhead and inherent disconnect associated with navigating through a displayed graphical interface to control physically touchable hardware modules.

With reference now to the Figures, example embodiments of the present disclosure will be discussed in further detail.

Figure 1A:
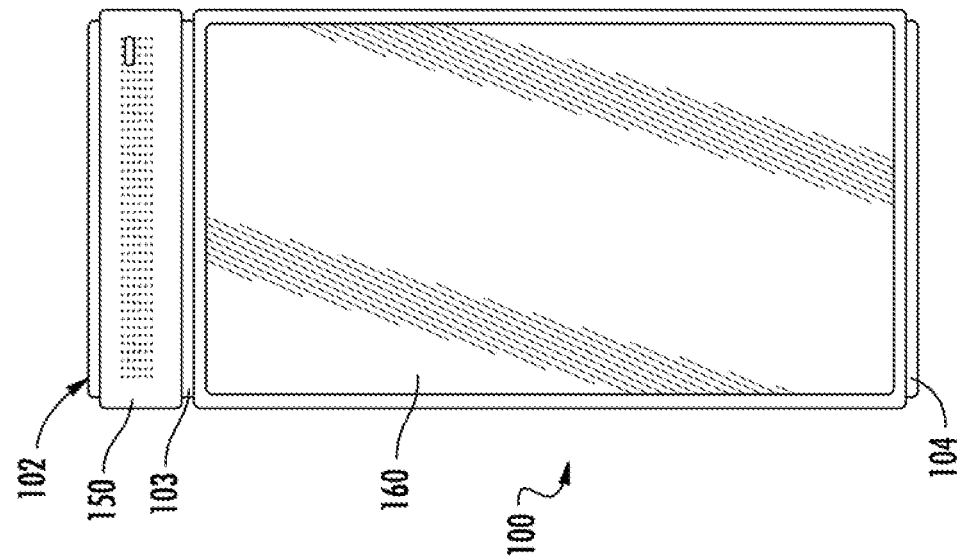
FIG. 1A depicts a front side of an example modular electronic device according to example embodiments of the present disclosure.
Figure 2B:
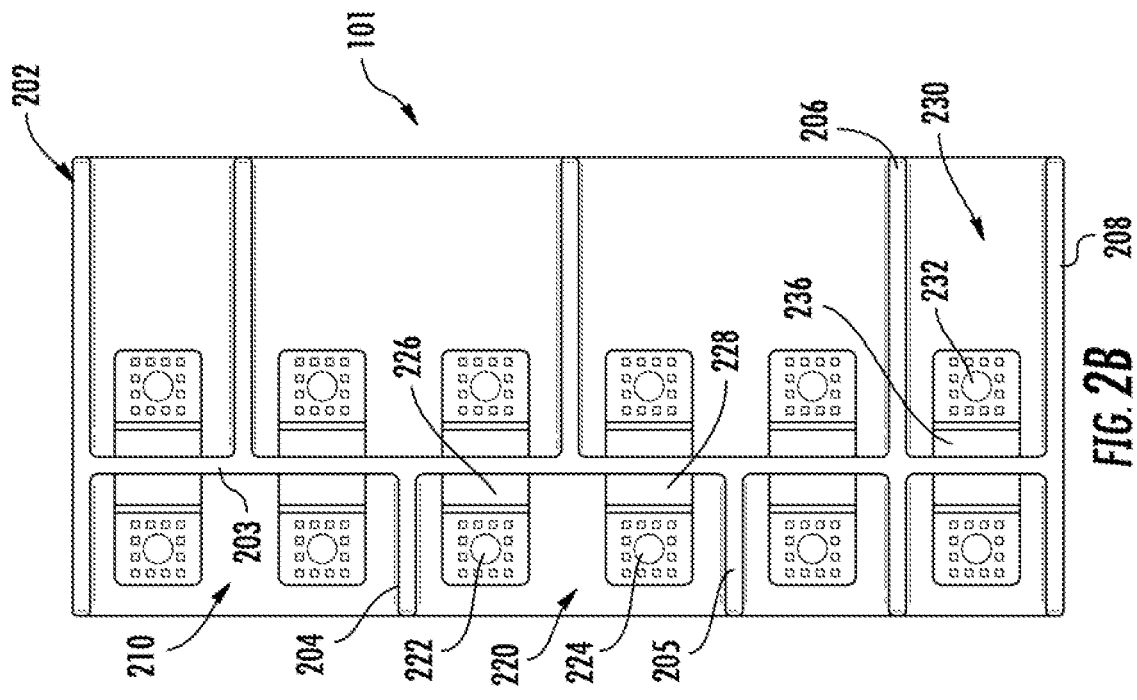
FIG. 2B depicts a rear side of an example frame of a modular electronic device according to example embodiments of the present disclosure.
Figure 2A:
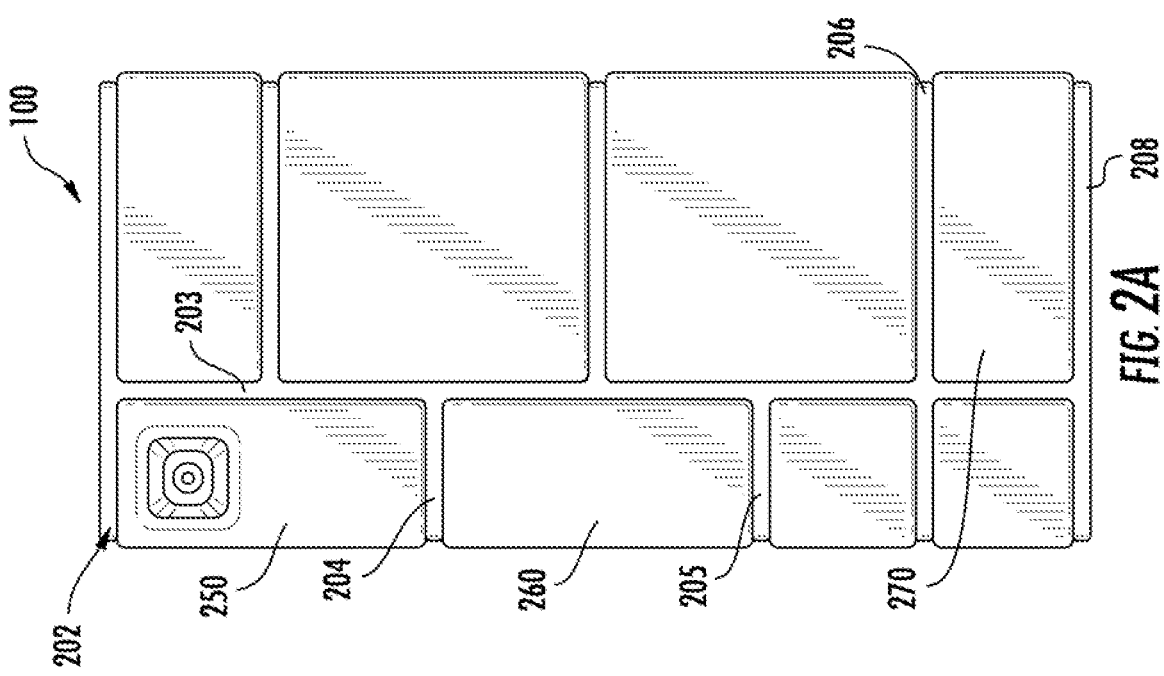
FIG. 2A depicts a rear side of an example modular electronic device according to example embodiments of the present disclosure.

FIG. 1A depicts a front side of an example modular electronic device 100 according to example embodiments of the present disclosure. FIG. 1B depicts a front side of an example frame 101 of the modular electronic device 100 according to example embodiments of the present disclosure. FIG. 2A depicts a rear side of the example modular electronic device 100 according to example embodiments of the present disclosure. FIG. 2B depicts a rear side of the example frame 101 according to example embodiments of the present disclosure. More particularly, FIGS. 1A and 2A depict the modular electronic device 100 with the electronic modules received at the frame 101, while FIGS. 1B and 2B depict the frame 101 of the modular electronic device 100 without the electronic modules (e.g., "naked").

Referring first to FIGS. 1A and 1B, the frame 101 can include a number of ridges or protrusions which serve to define a plurality of bays. For example, the front side of frame 101 includes an upper ridge 102, a middle ridge 103, and a lower ridge 104. The ridges 102, 103, and 104 can define or otherwise form a plurality of bays at which electronic modules can be respectively received. For example, the ridges 102, 103, and 104 can be sidewalls of the bays. In particular, the upper ridge 102 and the middle ridge 103 can define an upper bay 110, while the middle ridge 103 and the lower ridge 104 define a lower bay 120.

Each bay 110 and 120 can removably receive a respective electronic module. For example, electronic module 150 can be insertable and removable from the bay 110. Likewise, an electronic module 160 can be insertable and removable from the bay 120. As illustrated, each of the electronic modules 150 and 160 can have a footprint that matches the size and shape of the respective bay 110 and 120. The electronic module 150 can be a receiver or headset module, while the electronic module 160 can be a primary or front-facing display.

Each of the bays 110 and 120 can have at least one data connection interface and at least one latch to selectively secure the respective module within such bay. For example, bay 110 can include a data connection interface 112 and a latch 114. As illustrated, the data connection interface 112 can include a number of pins or prongs that permit electric coupling for data transfer to the corresponding electronic module 150. However, other forms of data couplers can be used in addition or alternatively to the illustrated connection interface 112. For example, various ports, pluggable connections, magnetic (e.g., inductive) couplings, or optical couplings can be used between the interface and the corresponding module. Similar to bay 110, bay 120 can include a data connection interface 122 and a latch 124.

Referring now to FIGS. 2A and 2B, the rear side of the frame 101 can also include a number of ridges or protrusions that form a plurality of bays. For example, the rear side of the frame 101 can have a spine 203 and a number of ribs, such as a rib 202, a rib 204, a rib 205, a rib 206; and a rib 208. As examples, the spine 203 and the ribs 202 and 204 can form a first bay 210; the spine 203 and the ribs 204 and 205 can form a second bay 220; and the spine 203 and the ribs 206 and 208 can form a third bay 230.

Each of the bays can removably receive a respective electronic module. As examples, the first bay 210 can receive a camera module 250; the second bay 220 can receive a wireless network interface module (e.g., a Wi-Fi interface module, a cellular data module, or a short-range wireless radio module such as a Bluetooth module); and the third bay 230 can receive a speaker module 270. Various other modules can be received by the frame as well, such as, for example, the positioning system module (e.g., a GPS module); a battery module, a USB interface module; a diversity antenna module; or various other types of modules. Further, the electronic modules can be interchangeable, swappable, or otherwise insertable into various different bays.

Each of the bays 210, 220, and 230 can have at least one data connection interface and at least one latch to selectively secure the respective module within such bay. As an example, the second bay 220 includes two data connection interfaces 222 and 224 and two latches 226 and 228. A particular electronic module inserted into the second bay 220 (e.g., electronic module 260) can utilize or otherwise employ one or both of the data connection interfaces 222 and 224. As another example, the third bay 230 can include a single data connection interface 232 and a single latch 236.

Figure 3:
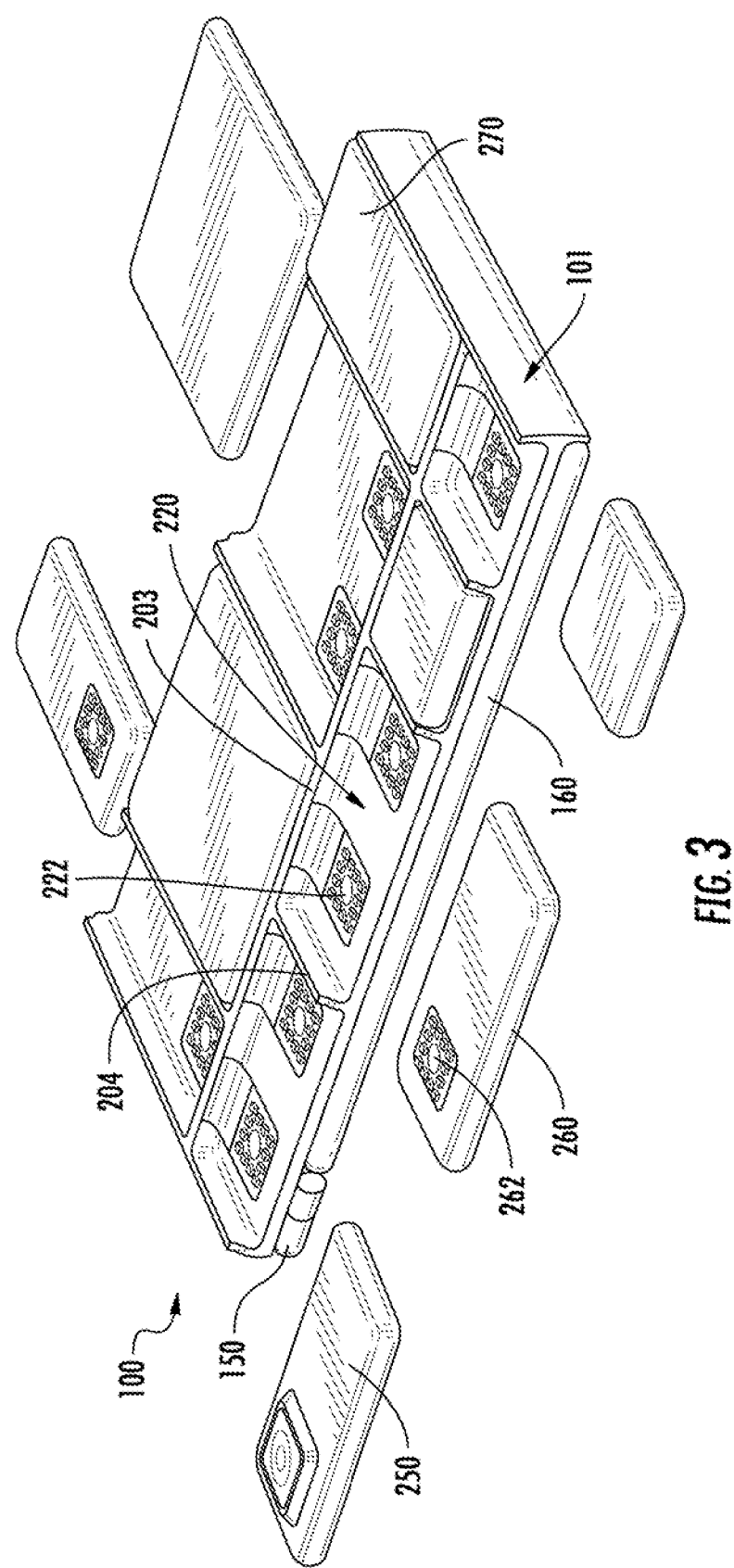
FIG. 3 depicts an isometric view of a rear side of an example modular electronic device according to example embodiments of the present disclosure.

FIG. 3 depicts an isometric view of the rear side of the example modular electronic device 100 according to example embodiments of the present disclosure. In particular, FIG. 3 depicts the electronic modules in various states of insertion or connection to the frame 101. For example, module 270 is received at the frame 101. However, module 250 and 260 are depicted as removed or otherwise not presently received at the frame 101. Further, module 260 is illustrated as being oriented with its interior surface facing up such that the data connection interface 262 of the electronic module 260 is observable. In particular, as an example, when the electronic module 260 is inserted into the second bay 220 of the frame 101, the data connection interface 262 of the electronic module 260 will engage with the data connection interface 222 of the second bay 222 form a plurality of electrical contacts over which data can be transferred according to various techniques In some implementations, the electronic modules can respectively slide into and out of respective bays of the frame 101. In other implementations, the electronic modules snap in and out of the respective bays. In yet other implementations, the electronic modules toe-in or clip-in to the respective bays. Furthermore, the particular shapes, sizes, orientations, and configurations of the electronic modules and bays illustrated in FIGS. 1A-3 are provided as one example only. Many different arrangements, shapes, sizes, etc. of the modules are possible.

Figure 4:
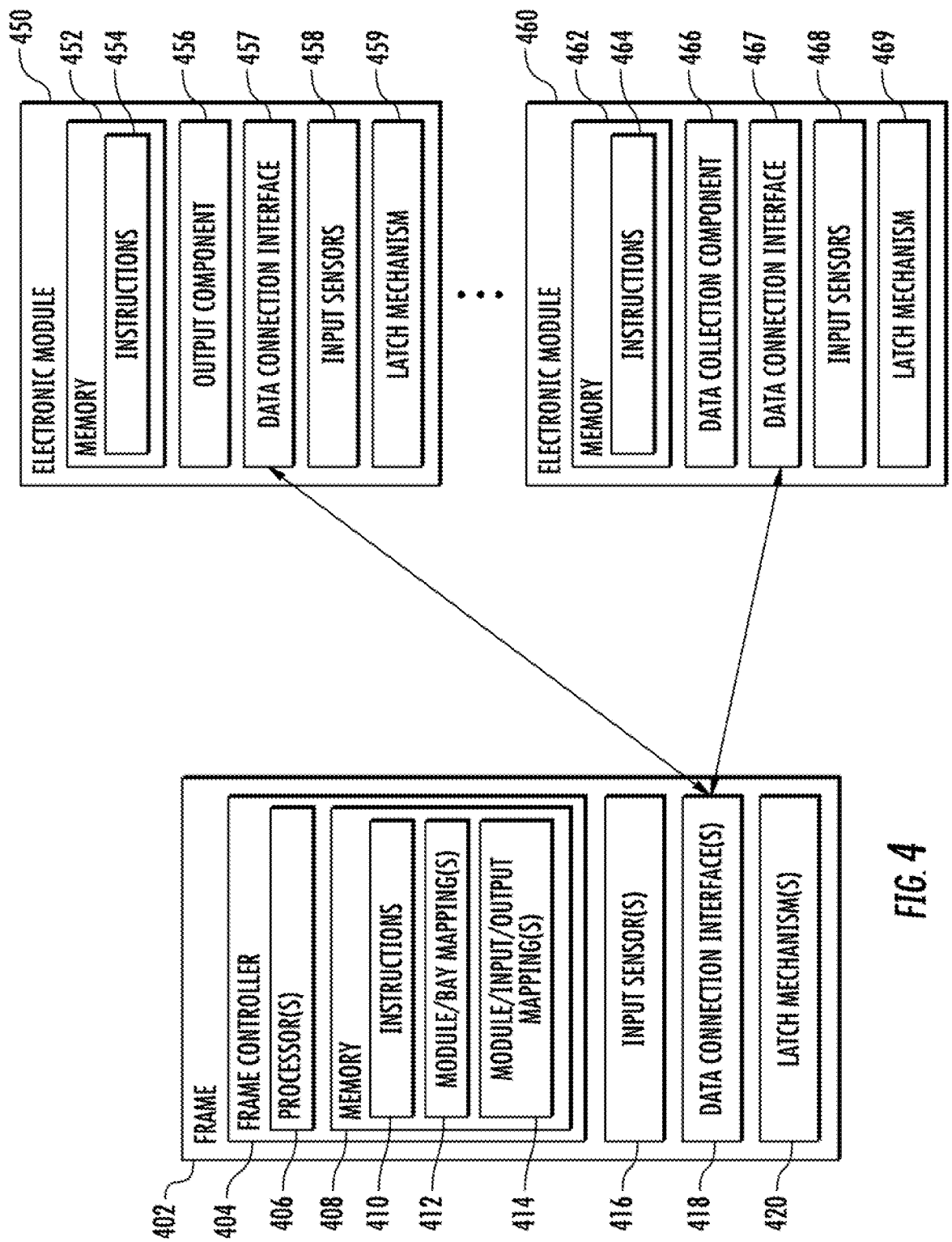
FIG. 4 depicts a block diagram of an example modular electronic device according to example embodiments of the present disclosure.

FIG. 4 depicts a block diagram of an example modular electronic device according to example embodiments of the present disclosure. The example modular electronic device includes a frame 402 and a plurality of electronic modules. Two representative example electronic modules 450 and 460 are illustrated in FIG. 4 for the purposes of explanation, however, the modular electronic device can have any number of electronic modules. In particular, the number of electronic modules included in the modular electronic device can change over time as modules are swapped in and out of the frame 402.

The frame 402 can include a frame controller 402, one or more input sensors 416, one or more data connection interfaces 418, and one or more latch mechanisms 420. In some implementations, the frame 402 does not include the input sensors 416 (e.g., implementations in which input sensors are included in the electronic modules).

The frame controller 404 can include one or more processors 406 and a memory 408. Processor 406 of the frame controller 402 can be any suitable processing device (e.g., microprocessor; microcontroller; ASIC; FPGA; etc.) and can be one processor or a plurality of processors that are operatively connected.

Memory 408 can include any number of non-transitory storage media such as RAM, ROM, flash, EEPROM, EPROM, etc. The memory 408 can store computer-readable instructions 410, one or more module/bay mappings 410, and one or more module/input/output mappings 414. Execution of the instructions 410 stored in memory 408 by the processor 406 can cause the frame controller 404 to perform operations consistent with the present disclosure.

The module/bay mapping 412 can logically associate various modules with the corresponding bay in which they are respectively received. As one example, with reference to FIG. 1A, the module/bay mapping 412 can logically associate electronic module 150 with bay 110, and/or vice versa. Thus, the module/bay mapping 412 can serve as a roster that maps received modules to the bays in which they are respectively received. The frame controller 404 can update the module/bay mapping 412 whenever an electronic module is inserted or removed from the frame 402, and/or on a periodic basis.

The module/input/output mapping 414 can logically associate, for each of one or more of the electronic modules, various inputs with respective outputs that should result from the associated input. To provide one non-limiting example, for a touch-sensitive rear-facing display module, the module/input/output mapping 414 can logically map a tap input to a display on/off output; logically map a press and hold input to a display brightness adjustment output; and/or logically map a swipe input to a control of a displayed user interface. Many different variations of input and output controls can be used.

In some implementations, the module/input/output mapping 414 can be customizable and/or definable based on user feedback or input. In some implementations, the module/input/output mapping 414 is a distributed mapping that is stored at the electronic modules in a distributed fashion (e.g., each module stores its own input/output mapping.

Furthermore, in some implementations, the module/input/output mapping 414 can logically associate different sets of inputs to respective outputs. For example, the sets of inputs can include different combinations of inputs (e.g., various different secondary conditions). To provide one non-limiting example, if a first button on the frame 402 is depressed when a particular module is tapped, the module can be activated; however, if a second, different button on the frame 402 is depressed when the particular module is tapped, the module can be released or ejected from the frame 402. Likewise, if both the first and second buttons on the frame 402 are depressed when the particular module is tapped, a third output function can result, and so on for various different sets of inputs.

The one or more input sensors 416 can include one or more of various sensors which generate data indicative of user input or other conditions. In one example, the one or more input sensors 416 can include at least one input sensor that provides data indicative of a location of a touch of the modular electronic device by a user. The one or more input sensors 406 can provide output data to the frame controller 404.

As one example, in some implementations, the frame 402 can include at least one input sensor 416 positioned within each of the plurality of bays. For example, each input sensor 416 can be a switch that is actuatable by a press of the electronic module received in the respective bay toward the frame. For example, each switch can be an electrical dome switch or other pressure sensitive switch. Thus, by pressing one of the electronic modules toward the frame, the corresponding switch within the bay is actuated and the touch of the module can be detected or otherwise recognized by the frame controller 404.

As another example, the at least one input sensor 416 can include a plurality of capacitive sensors respectively positioned in the plurality of bays. For example, each of the electronic modules received within the frame can be grounded so that the frame is operable to detect a change in capacitance at a respective one of the plurality of capacitive sensors due to the touch of the electronic module. Other capacitive sensor arrangements can be used as well.

As yet another example, the at least one input sensor 416 can include a RADAR system that sends, receives, and processes radio waves to determine the location of the touch of the modular electronic device by the user. Likewise, the at least one input sensor 416 can include a computer vision system that processes imagery captured by a camera of the modular electronic device to determine the location of the touch of the modular electronic device by the user. As another example, the at least one input sensor 416 can include an inertial system that analyzes a moment indicated by data from one or more gyroscopes or accelerometers of the modular electronic device to determine the location of the touch of the modular electronic device by the user.

Thus, the at least one input sensor 416 of the frame 402 can provide data indicative of a location of a touch of the modular electronic device by a user. The frame controller 404 can receive such data from the at least one input sensor 416 and can identify, based at least in part on such data, which of the plurality of electronic modules corresponds to the location of the touch by the user. Further, each of the above described input sensors can be located in one or more of the electronic modules in addition or alternatively to the frame 402.

The frame 402 can also include at least one data connection interface 418 that communicatively couples the plurality of electronic modules to the frame controller 404. As one example, the frame 404 can include at least one data connection interface 418 in each of the plurality of bays. The at least one data connection interface 418 can provide bi-directional communications between the frame controller 404 and the electronic module via one or more electrical, magnetic (e.g., inductive), or optical couplings between the interface 418 and the corresponding module (e.g., with a complementary data connection interface of the electronic module). As an example, the data connection interface 418 of each bay can include a number of complementary pairs of prongs, pins, contacts, or the like to form a number of serial data connections or other forms of data connection. In other implementations, the at least one data connection interface 418 of the frame 402 can perform wireless communication with one or more of the electronic modules (e.g., according to a short-range wireless communications protocol such as Bluetooth).

The frame 402 can also include one or more latch mechanisms 420 which serve to selectively retain electronic modules within their respective bays. In some implementations, the frame 402 includes at least one latch mechanism 420 within each of the plurality of bays.

As one example, the latch mechanism 420 within each bay can include an electropermanent magnet included in the frame. When activated, the electropermanent magnet creates a magnetic field that serves to magnetically hold the electronic module within the bay.

As another example, in some implementations, each bay can include a fixed retention member associated with a wall or surface of the bay and each electronic module can include a release member at least partially housed within the associated module housing that is configured to releaseably engage the retention member. For example, the release member may be movable relative to the retention member between a locked position, wherein the retention member is configured to engage the release member so as to retain the electronic module within the bay, and an unlocked position, wherein the release member is disengaged from the retention member to allow the electronic module to be removed from the bay. Additionally, the electronic module may include an electromechanical actuator coupled to the release member that is configured to actuate or move the release member between its locked and unlocked positions. For example, when it is desired to remove the electronic module from the bay, a suitable electrical signal may be transmitted to the electromechanical actuator. Upon receipt of the electrical signal, the electromechanical actuator may mechanically disengage the release member from the retention member, thereby allowing the electronic module to be removed from the bay.

In some implementations, the retention member may correspond to a projection or lip extending outwardly from the floor or bottom surface of the bay and the release member may correspond to an actuatable hook at least partially housed within the module housing. In such implementations, the lip may define one or more cavities or openings configured to receive a portion of the hook when the hook is moved to the locked position. Additionally, in some implementations, the electromechanical actuator can include one or more shape memory wires coupled between the hook and a current source. When an electrical current is supplied through the wire(s), the wire(s) may contract, thereby pulling the hook away from the lip and disengaging the housing module from the bay. The electronic module may then be removed from the bay.

In other implementations, the respective locations and configuration of the retention/release members may be reversed, with the retention member being associated with the electronic module and the release member and electromechanical actuator being associated with the bay. Additionally, in alternative implementations, the electromechanical actuator may correspond to any other suitable actuator, such as a solenoid activated piston and/or any other suitable actuator configured to convert an electrical signal to mechanical motion for engaging and/or disengaging the release member.

Moreover, in several implementations, each bay and/or electronic module may include a biasing member configured to bias the module away from the bay when the release member is moved to its unlocked position, thereby allowing the module to be quickly and easily removed from the bay. In some implementations, the force provided by the biasing member is of sufficient magnitude so as to cause physical ejection of the module when the release member is moved to its unlocked position. For example, in one embodiment, magnets may be housed within both the bay and the module housing that are configured to repel one another. As such, when the release member is disengaged from the retention member, the repulsive force between the magnets may result in in a portion of the module housing pivoting outwardly away from the bay. Such portion of the module housing may then be grabbed to facilitate removal of the electronic module. In other implementations, any other suitable biasing mechanism may be utilized, such as one or more springs or deformable elements.

Additionally, in several implementations, a biasing member may be provided in operative association with the release member in order to bias the release member into its locked position. For example, in some implementations, a spring is engaged against the release member so as to bias the release member towards the retention member. As such, when the electronic module is initially installed within the bay, the biasing member may force the release member into engagement with the retention member. The electromechanical actuator may then be subsequently used to disengage the release member when it is desired to remove the module from the bay.

In some implementations, the frame 402 further includes one or more buttons on a side of the frame. For example, the buttons can be the same as or similar to volume control buttons typically seen on mobile computing devices. In yet further implementations, the frame 402 can include a switch that has at least one component that is temporarily pullable away from the frame by a user. The pullable component can retract once released by the user.

The example electronic module 450 can include a memory 452, an output component 456, a data connection interface 457, one or more input sensors 458, and a latch mechanism 459. In some implementations (e.g., implementations in which the frame 402 includes input sensors 416), the electronic module 450 may not include the input sensor 457.

Memory 452 can include any number of non-transitory storage media such as RAM, ROM, flash, EEPROM, EPROM, etc. The memory 452 can store computer-readable instructions 454 that are executable by the frame controller 404. Execution of the instructions 454 stored in memory 452 by the frame controller 404 can enable functionality provided by the electronic module 450 (e.g., operation of the output component 456).

In some implementations, the electronic module 450 further includes a processor within the module. The processor can execute the instructions 454. For example, the processor can execute the instructions 454 when prompted to do so by the frame controller 404.

The output component 456 can be any component that performs an output function, such as, for example, outputting light, sound, or haptic feedback. As examples, the output component 456 can include a speaker, a visual battery life indicator, a rear-facing display, a wireless communications interface (e.g., a wireless network radio), a flashlight, or various other components that output light, sound, or haptic feedback.

In some implementations, the data connection interface 457 is the same as, similar to, or complementary to the data connection interface 418 described above. For example, the data connection interface 457 can include a number of prongs, pins, or other electrical connections that are designed to mate with complementary connections at the data connection interface 418.

In some implementations, the input sensor 458 is the same as, similar to, or complementary to the input sensors 416 described above. As one example, the input sensor 458 can include at least one switch. The at least one switch in the module 450 can be actuatable by a press of the electronic module 450 toward the bay in which it is received. For example, the switch can be an electrical dome switch or other pressure sensitive switch. Thus, by pressing the electronic module 450 toward the frame 402, the switch can be actuated and data indicative of the touch of such module can be transmitted to the frame controller 404 (e.g., via the data connection interfaces 457 and 418).

In some implementations, the latch mechanism 459 is the same as, similar to, or complementary to the latch mechanism 420 discussed above.

The example electronic module 460 can include many of the same components as the electronic module 450: such as a memory 462 that stores instructions 464; a data collection interface 467; at least one input sensor 468; and a latch mechanism 469.

However, alternatively (or in addition) to the output component 456 of the electronic module 450, the electronic module 460 can include a data collection component 466. The data collection component 466 can include any component, sensor, device, etc. that collects or generates data indicative of a physical condition. As examples, the data collection component 466 can include a pulse monitor, an oxygen level monitor, a glucose monitor, a credit card reader, a camera, a microphone, and/or various other types of sensors that collect data about a physical condition.

Figure 5:
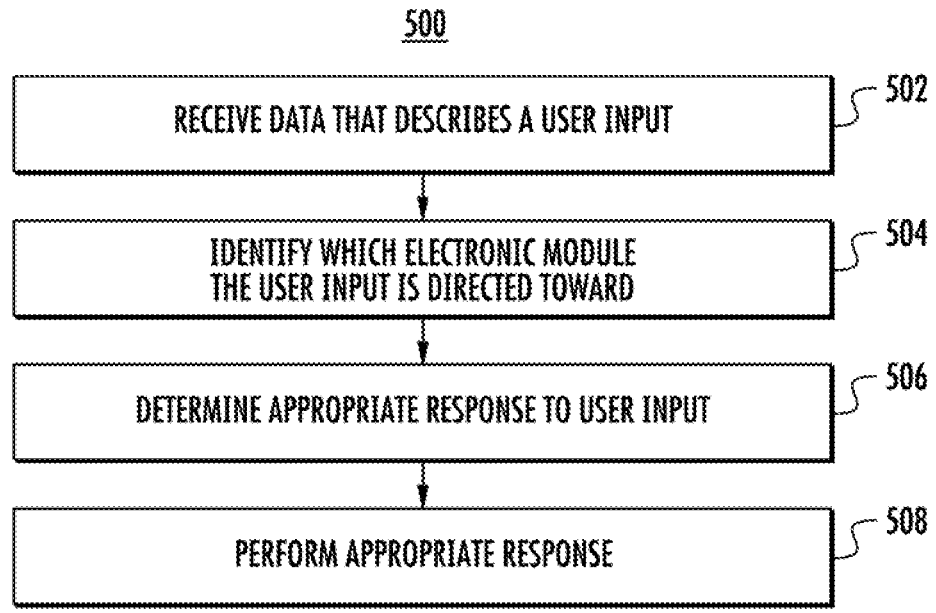
FIG. 5 depicts a flow chart of an example method to operate a modular electronic device according to example embodiments of the present disclosure.

FIG. 5 depicts a flow chart of an example method 500 to operate a modular electronic device according to example embodiments of the present disclosure.

At 502, the frame controller receives data that describes a user input. For example, the frame controller can receive data from at least one input sensor that describes a location of a touch of the modular electronic device by a user. For example, the touch can include a tap gesture. In further implementations, various different types of gestures relative to a particular module can be detected.

At 504, the frame controller identifies toward which electronic module the user input is directed. As one example, based on the received data, the frame controller can identify a particular bay that is associated with the location of the touch of the modular electronic device. The frame controller can then consult a module/bay mapping to determine the identity of the electronic module received in the particular bay.

At 506, the frame controller determines an appropriate response to the user input. As one example, having identified a particular electronic module, the frame controller can consult a module/input/output mapping to determine the appropriate output with respect to the identified module for a given set of inputs. Thus, the frame controller can also detect, assess, or determine the status of various other input parameters in addition to the touch of the modular electronic device. As one example, the frame controller can determine whether a secondary condition is satisfied, where satisfaction of the secondary condition changes the response to the touch of the modular electronic device. Thus, for a particular set of inputs (e.g., a first button on a side of the frame depressed during a touch of a particular module), the frame controller can determine an appropriate output (e.g., activation of the module, enabling certain functionality of the module, enabling removal of the module, etc.).

At 508, the frame controller performs the appropriate response. For example, the frame controller can enable operation, removal, or other interactions with or functions of the electronic module.

Figure 6:
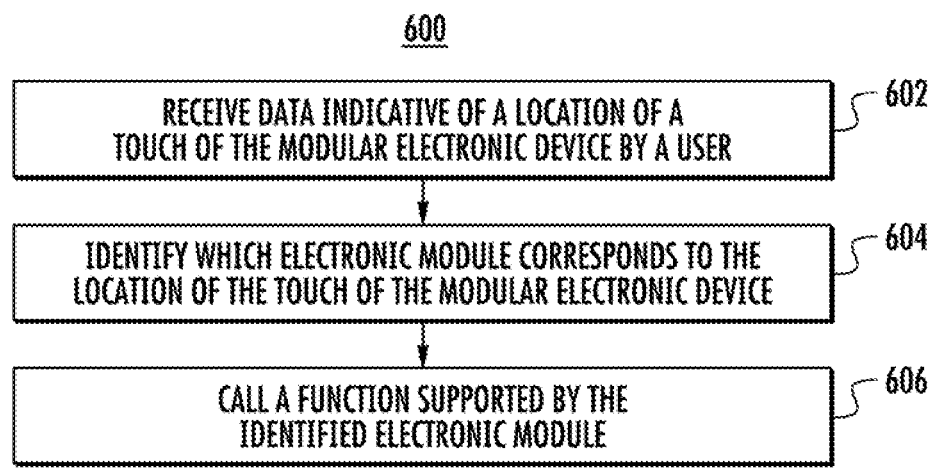
FIG. 6 depicts a flow chart of an example method to operate a modular electronic device according to example embodiments of the present disclosure.

FIG. 6 depicts a flow chart of an example method 600 to operate a modular electronic device according to example embodiments of the present disclosure.

At 602, the frame controller receives data indicative of a location of a touch of the modular electronic device by a user. For example, the frame controller can receive data from at least one input sensor that describes a location of a touch of the modular electronic device by a user. For example, the touch can include a tap gesture. In further embodiments, various different types of gestures relative to a particular module can be detected.

At 604, the frame controller identifies which electronic module corresponds to the location of the touch of the modular electronic device. As an example, in some implementations, the frame controller maintains a mapping that respectively maps the plurality of electronic modules to the plurality of bays in which they are respectively received. Thus, in such implementations, identifying the electronic module at 604 can include identifying, by the frame controller based at least in part on the received data, which of the plurality of bays corresponds to the location of the touch of the modular electronic device by the user; and consulting, by the frame controller, the mapping to identify the electronic module received at the identified bay.

At 606, the frame controller calls a function supported by the identified electronic module. In some implementations, calling the function at 606 can include accessing, by the frame controller, a set of instructions stored at the identified electronic module; and executing, by the frame controller, the set of instructions to enable the identified electronic module to perform the function. In other implementations, the frame controller prompts an additional processor internal to the identified electronic module to access and execute the set of instructions. In some implementations, calling the function at 606 includes causing a flow of power to be provided to the identified electronic module.

In some implementations, the modular electronic device operatively responds to the user touch of an electronic module (e.g., by calling a function supported by the module) only when a secondary condition is satisfied at the time of the touch. Thus, in such implementations, the method 600 can further include determining, by the frame controller, whether a secondary condition is satisfied at the time of the touch. The frame controller then calls the function at 606 only when the secondary condition is satisfied at the time of the touch.

Various different secondary conditions can be used to provide selective control of the device. As examples, in some implementations, determining, by the frame controller, whether the secondary condition is satisfied at the time of the touch can include at least one of: determining, by the frame controller, whether a button of the frame is pressed at the time of the touch; determining, by the frame controller, whether, at the time of the touch, the modular electronic device is oriented within a range of orientations associated with user interaction with the identified electronic module (e.g., generally facing downwards); and/or determining, by the frame controller, whether, at the time of the touch, a touch-sensitive display screen of the modular electronic device is also being touched.

In such fashion, incidental contact by the user with one of the modules does not trigger the operations of the present disclosure. Instead, in such implementations, only when the secondary condition is satisfied does the modular electronic device enable the user to operate or otherwise interact with the electronic modules by touching or pressing a particular electronic module.

Figure 7:
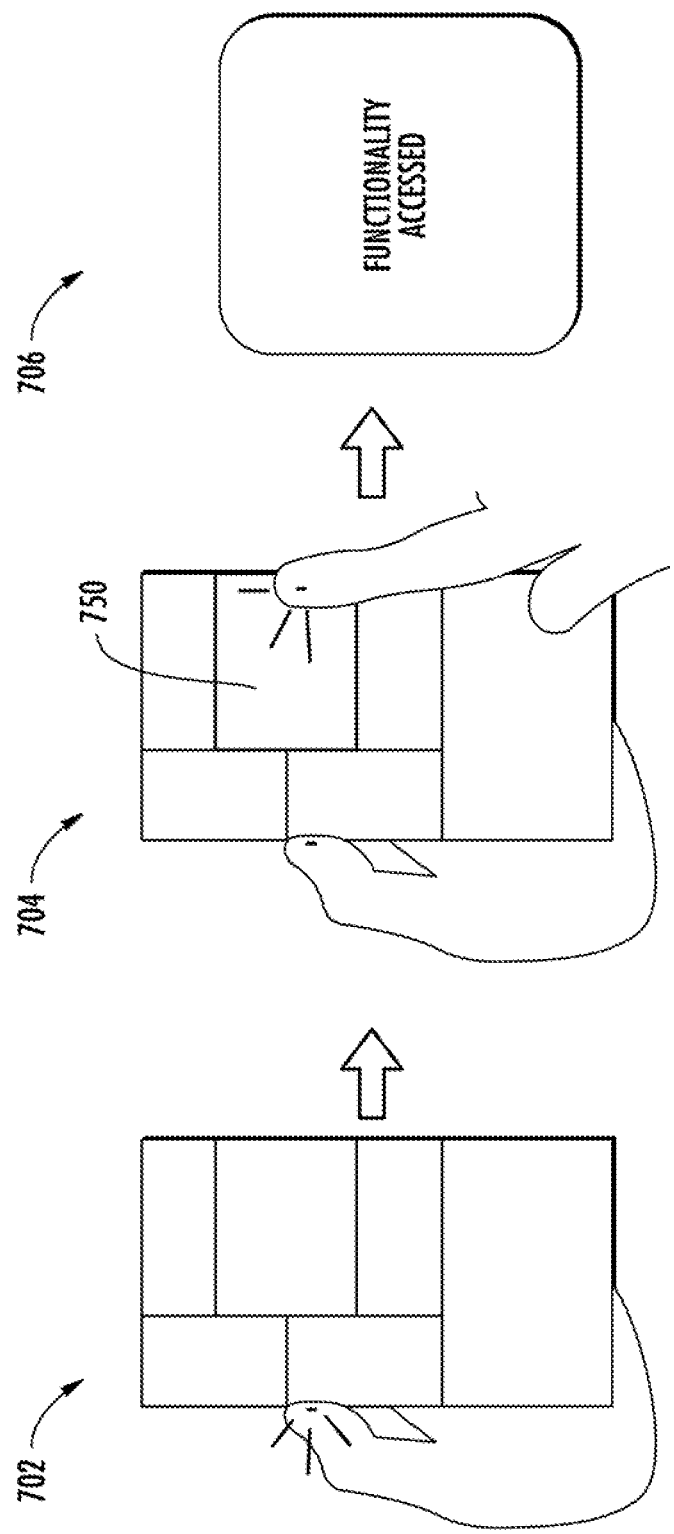
FIG. 7 depicts operation of an example modular electronic device to access module functionality according to example embodiments of the present disclosure.

FIG. 7 depicts operation of an example modular electronic device to access module functionality according to example embodiments of the present disclosure. At 702, a user presses a button on a side of the frame of the modular electronic device. At 704, the user touches a particular module 750 of the plurality of electronic modules. For example, at 704, the user can tap, press and hold, swipe, make a pattern (e.g., a pattern specific to the electronic module 750), or other gestures. At 706, one or more functions associated with the electronic module 750 are made accessible to the user (e.g., by the frame controller).

Furthermore, in the example illustration of FIG. 7 and those that follow, the press of the button on the side of the frame of the modular electronic device is provided as one example secondary condition only. Any one or more of many different secondary conditions can be used in addition or alternatively to the press of the a button on the side of the frame.

Figure 8:
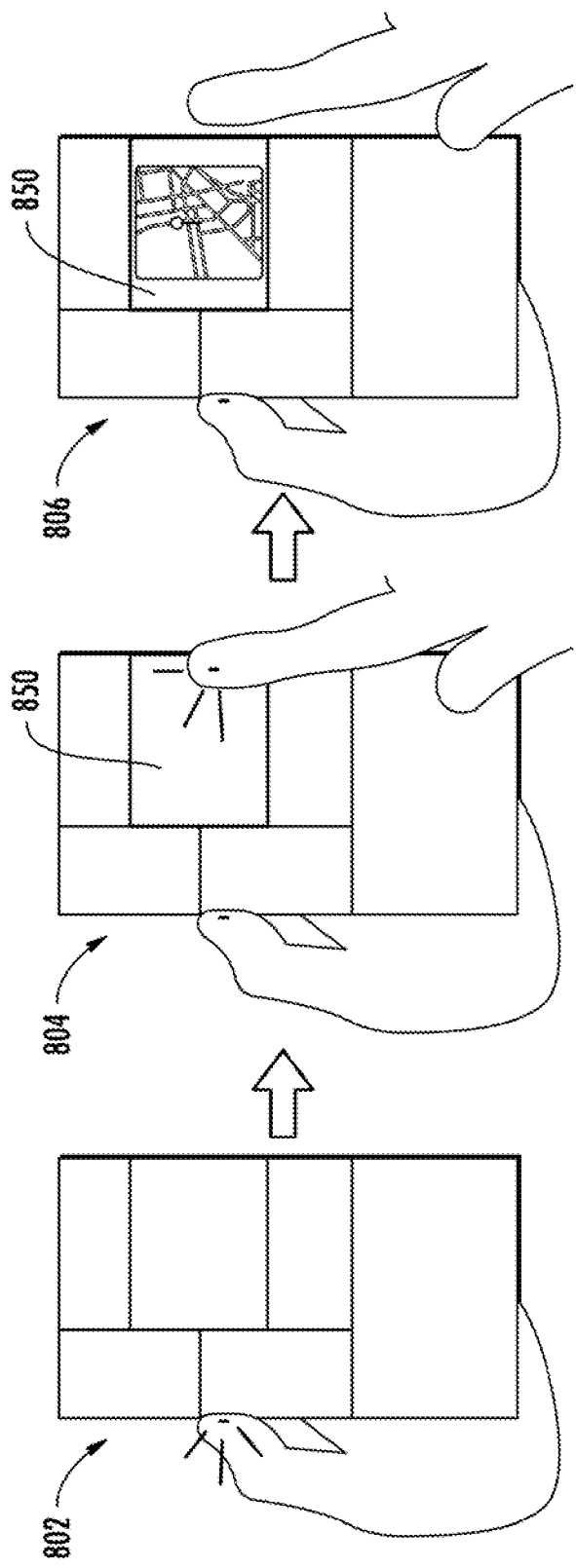
FIG. 8 depicts operation of an example modular electronic device to enable a rear-facing display module according to example embodiments of the present disclosure.

FIG. 8 depicts operation of an example modular electronic device to enable a rear-facing display module 850 according to example embodiments of the present disclosure. At 802, the user presses a button on a side of the frame of the modular electronic device. At 804, the user touches the rear-facing display module 850. At 806, the rear-facing display 850 is activated (e.g., by the frame controller) to display content (e.g., a mapping application user interface, as illustrated in FIG. 8). The user can swipe or otherwise navigate through various user interfaces or other display elements of a collection of applications on the rear-facing display module 850. The rear-facing display module 850 can have any type of display (e.g., an LCD display, a touch-sensitive display, etc.).

Figure 9:
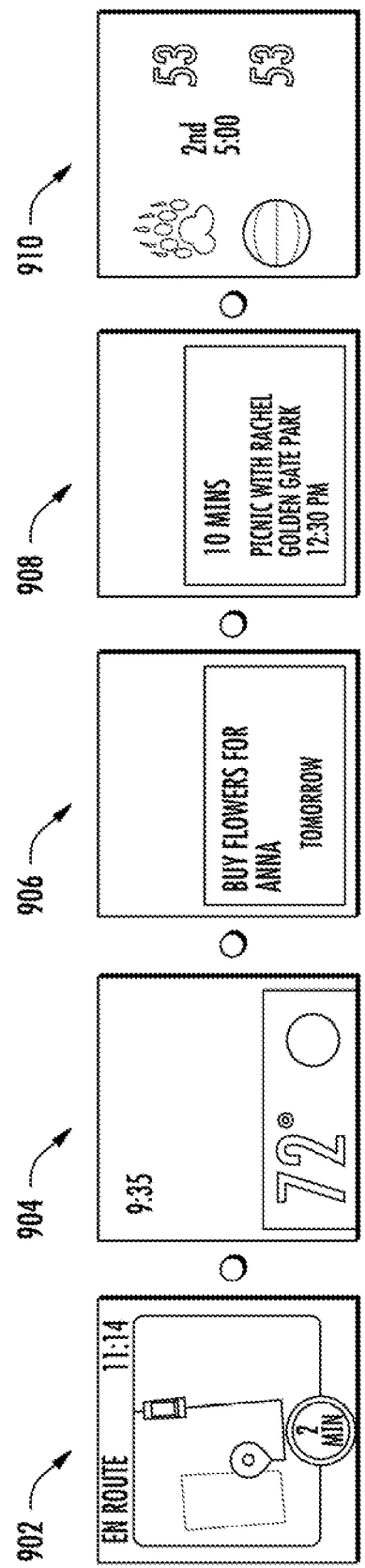
FIG. 9 depicts example user interfaces for various applications displayable on a rear-facing display module according to example embodiments of the present disclosure.

FIG. 9 depicts example user interfaces for various applications displayable on a rear-facing display module according to example embodiments of the present disclosure. In particular, FIG. 9 depicts a user interface 902 of a ridesharing application; a user interface 904 of a weather application; a user interface 906 of a calendar application; a user interface 908 of an intelligent personal assistant application; and a user interface 910 of a live score application. The user interfaces illustrated in FIG. 9 are provided as examples only. Any form of user interface can be displayed on the rear-facing display.

FIG. 10 depicts operation of an example modular electronic device to enable a sensor module 1050 according to example embodiments of the present disclosure. At 1002, the user presses a button on a side of the frame of the modular electronic device. At 1004, the user touches sensor module 1050. At 1006, the sensor module 1050 is activated (e.g., by the frame controller) to collect data (e.g., about a physical condition). In some implementations, as illustrated in FIG. 10, the sensor module 1050 is a pulse sensor module.

FIG. 11 depicts operation of an example modular electronic device to enable a speaker module 1102 according to example embodiments of the present disclosure. At 1102, the user presses a button on a side of the frame of the modular electronic device. At 1104, the user touches speaker module 1150. At 1106, the speaker module 1150 is activated (e.g., by the frame controller) to produce sound.

FIG. 12 depicts operation of an example modular electronic device to enable a camera module 1250 according to example embodiments of the present disclosure. At 1202, the user presses a button on a side of the frame of the modular electronic device. At 1204, the user touches camera module 1250. At 1206, the camera module 1250 is activated (e.g., by the frame controller) to capture at least one image. For example, as illustrated, in response to the touch, the camera module 1250 can start a three second countdown timer. At the end of the countdown timer, the camera module can capture an image (e.g., with or without operation of a flash).

FIG. 13 depicts operation of an example modular electronic device to enable a battery life indicator module 1350 according to example embodiments of the present disclosure. At 1302, the user presses a button on a side of the frame of the modular electronic device. At 1304, the user touches battery life indicator module 1350. At 1306, the battery life indicator module 1350 is activated (e.g., by the frame controller) to provide an indication of remaining battery life. For example, as illustrated, the battery life indicator module 1350 can include a number of LEDs which are illuminable to indicate battery life.

Figure 14:
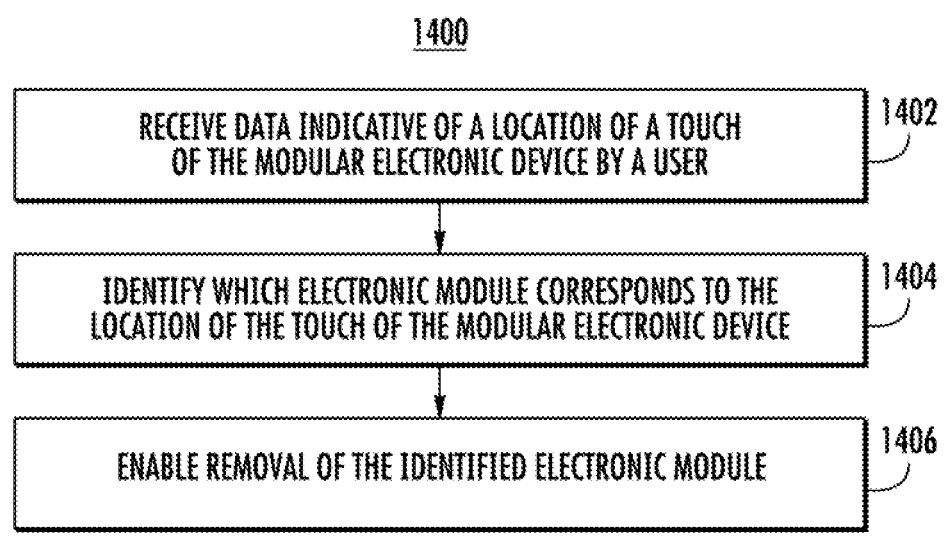
FIG. 14 depicts a flow chart of an example method to operate a modular electronic device according to example embodiments of the present disclosure.

FIG. 14 depicts a flow chart of an example method 1400 to operate a modular electronic device according to example embodiments of the present disclosure.

At 1402, the frame controller receives data indicative of a location of a touch of the modular electronic device. For example, the frame controller can receive data from at least one input sensor that describes a location of a touch of the modular electronic device by a user. For example, the touch can include a tap gesture. In further embodiments, various different types of gestures relative to a particular module can be detected.

At 1404, the frame control identifies which electronic module corresponds to the location of the touch of the modular electronic device. As an example, in some implementations, the frame controller maintains a mapping that respectively maps the plurality of electronic modules to the plurality of bays in which they are respectively received. Thus, in such implementations, identifying the electronic module at 1404 can include identifying, by the frame controller based at least in part on the received data, which of the plurality of bays corresponds to the location of the touch of the modular electronic device by the user; and consulting, by the frame controller, the mapping to identify the electronic module received at the identified bay.

At 1406, the frame controller enables removal of the identified electronic module. For example, at 1406 the frame controller can control one or more latch mechanisms to allow removal of the identified electronic module.

In some implementations, enabling removal of the identified electronic module at 1406 can include preparing the module for removal. Preparing the module for removal can include storing, by the frame controller, at a non-volatile computer-readable medium one or more items of data associated with the identified electronic module and previously stored in a volatile computer-readable medium; and eliminating, by the frame controller, a flow of power from a power source of the modular electronic device to the identified electronic module. The non-volatile computer-readable medium can be included in the frame or in the identified electronic module.

As another example, in some implementations, enabling removal of the identified electronic module at 1406 can include causing, by the frame controller, physical ejection of the identified electronic module from the corresponding bay. For example, in some implementations, causing physical ejection of the identified electronic module can include controlling, by the frame controller, a latch of the corresponding bay to result in physical ejection of the identified electronic module. In particular, as an example, the frame and/or module can include a biasing member or other ejector that continuously provides repulsive forces between the module and the frame. Therefore, when the latch is controlled to unsecure the module from the bay, the repulsive forces can cause physical ejection of at least a portion of the module. In other implementations, the biasing member can be controllable to provide the repulsive forces when ejection is desired.

In some implementations, the modular electronic device operatively responds to the user touch of an electronic module (e.g., by enabling removal of the module) only when a secondary condition is satisfied at the time of the touch. Thus, in such implementations, the method 1400 can further include determining, by the frame controller, whether a secondary condition is satisfied at the time of the touch. The frame controller then enables removal of the identified electronic module at 1406 only when the secondary condition is satisfied at the time of the touch.

Various different secondary conditions can be used to provide selective control of the device. As examples, in some implementations, determining, by the frame controller, whether the secondary condition is satisfied at the time of the touch can include at least one of: determining, by the frame controller, whether a button of the frame is pressed at the time of the touch; determining, by the frame controller, whether, at the time of the touch, the modular electronic device is oriented within a range of orientations associated with user interaction with the identified electronic module (e.g., generally facing downwards); determining, by the frame controller, whether at least one component of a switch has been pulled away from the frame; and/or determining, by the frame controller, whether, at the time of the touch, a touch-sensitive display screen of the modular electronic device is also being touched.

Further, in some implementations, the secondary condition requires a continuous user input to be satisfied. For example, a continuous user input can require that the user continuously perform an input action (e.g., press and hold a button or pull and hold a component of a switch of the frame away from the frame), rather than being satisfied by previous, but not continuous, user input, such as previously switching a toggle to a certain position. In such fashion, inadvertent removal of electronic modules can be reduced, as the user is required to provide continuous input to trigger operation, ejection, or other activities associated with the module.

In such fashion, incidental contact by the user with one of the modules does not trigger the operations of the present disclosure. Instead, in such implementations, only when the secondary condition is satisfied does the modular electronic device enable removal of the electronic modules by touching or pressing a particular electronic module.

Figure 15:
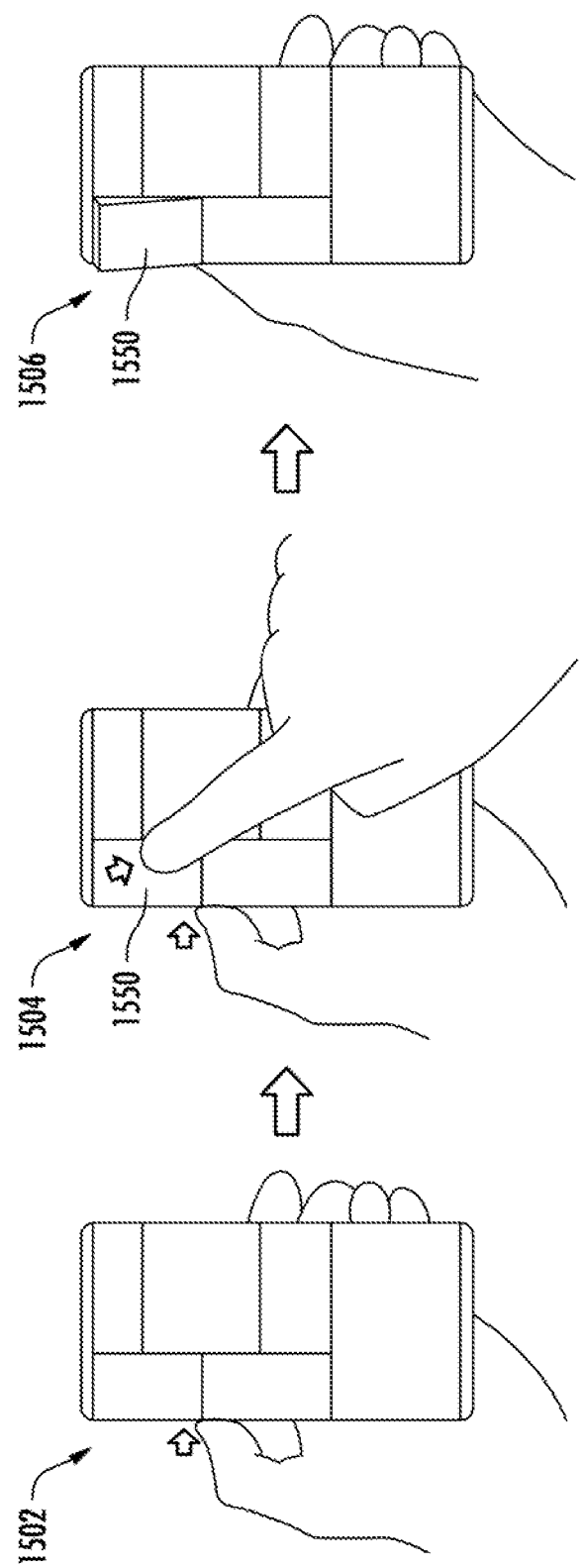
FIG. 15 depicts operation of an example modular electronic device to remove an electronic module according to example embodiments of the present disclosure.

FIG. 15 depicts operation of an example modular electronic device to remove an electronic module 1550 according to example embodiments of the present disclosure. At 1502, the user presses a button on a side of the frame of the modular electronic device. At 1504, the user touches the electronic module 1550 that the user wishes to remove. At 1506, removal of the touched module 1550 is enabled (e.g., by the frame controller). For example, as illustrated, the touched module 1550 can be physically ejected from the frame.

Figure 16:
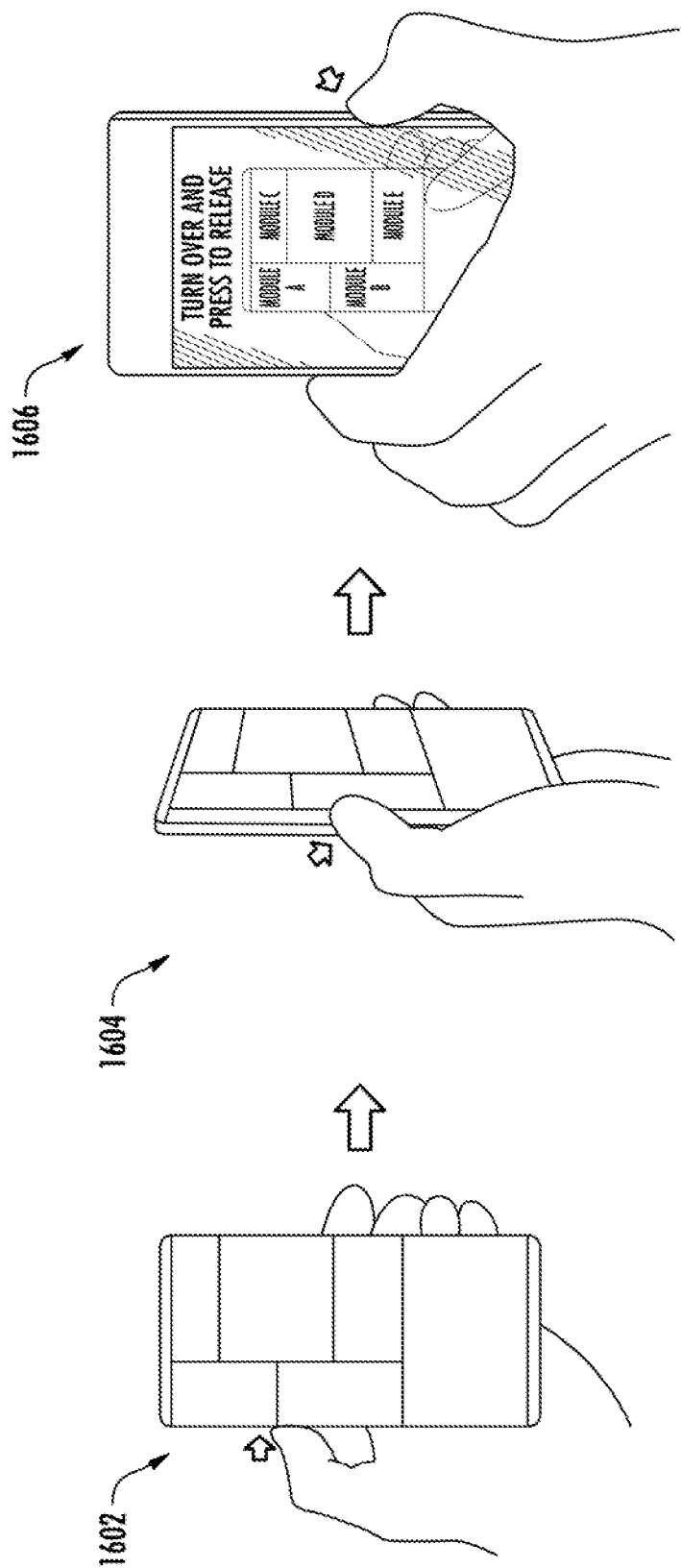
FIG. 16 depicts operation of an example modular electronic device to cause display of a visual representation of a module/bay mapping.

FIG. 16 depicts operation of an example modular electronic device to cause display of a visual representation of a module/bay mapping. At 1602, the user presses a button on a side of the frame of the modular electronic device. At 1604, the user turns the modular electronic device over to view a primary display at the front of the device. At 1606, the modular electronic device displays a guide that provides instructions on how to request removal of a particular module. For example, the guide can include a visual representation of a module/bay mapping. Thus, a useful and informative graphic that identifies each module and provides instructions for removal can be provided (e.g., in response to satisfaction of the secondary condition).

In some implementations, the visual representation of the module/bay mapping can include instructions for removal of a particular module. For example, in some implementations, as illustrated in FIG. 16, the visual representation can include instructions to turn the modular electronic device over and press or otherwise touch a particular module in order to cause the selected module to be released or otherwise made removable.

In other implementations, the visual representation of the module/bay mapping or other similar graphical displays can themselves be interactive. In particular, in some implementations of the present disclosure, instead of selecting a particular module for release or removal by physically touching the particular module as described above, the user can interact with a user interface (e.g., a module removal menu) provided on a display of the modular electronic device to request removal of a particular module. Thus, screen-based user interface controls for module removal can be provided in addition or in alternative to the touch-based controls for module removal.

Figure 17:
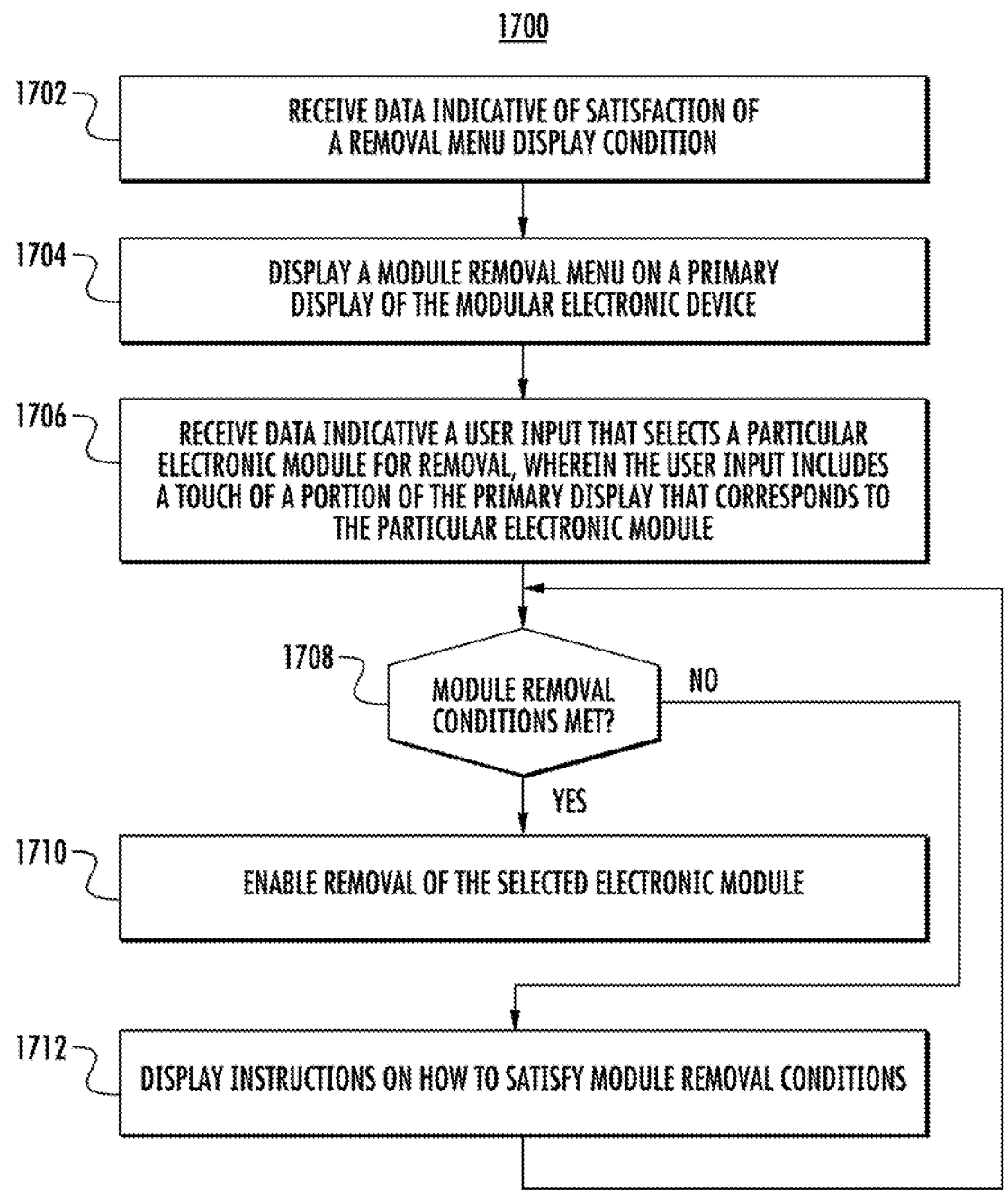
FIG. 17 depicts a flow chart of an example method to operate a modular electronic device according to example embodiments of the present disclosure.

As one example, FIG. 17 depicts a flow chart of an example method 1700 to operate a modular electronic device according to example embodiments of the present disclosure.

At 1702, the frame controller receives data indicative of satisfaction of a removal menu display condition. The removal menu display condition can be one or more conditions that, when satisfied, cause the modular electronic device to display a module removal menu. As one example, the removal menu display condition can include a press (e.g., a press and hold) of a button on a side of the frame of the modular electronic device. Thus, in some implementations, at 1702, the frame controller receives data that indicates that the user is pressing and holding the button on the side of the frame. However, the removal menu display condition can be any number of other inputs, conditions, or parameters.

At 1704, the frame controller causes display of a module removal menu on a primary display of the modular electronic device. For example, the primary display may be a front-facing display. In some implementations, the module removal menu includes a plurality of menu portions that respectively correspond to the plurality of electronic modules available for removal. As one example, the module removal menu may be a graphical representation of the rear side of the modular electronic device, where the graphical representation includes different sections or portions that spatially mimic the relative sizes and shapes of the received modules. For example, the module removal menu may appear visually the same as or similar to the visual representation of the module/bay mapping illustrated in FIG. 16. However, in other implementations, the module removal menu may simply be a textual listing of modules or other type of menu.

At 1706, the frame controller receives data indicative of a user input that selects a particular electronic module for removal. In particular, the user input can select a particular electronic module for removal through interaction with the module removal menu. As one example, at 1706, the user input can include a touch of a portion of the primary display that corresponds to the particular electronic module. For example, with reference to FIG. 16, the user could select Module D for removal by touching the portion of the display screen on which Module D is graphically shown. However, other, different user inputs that interact with other module removal menus can be received, as well. For example, module removal menus can include scrolling, double-tapping, swiping, or other gestural controls or user interactions to select a module for removal.

At 1708, the frame controller determines whether one or more module removal conditions are met. The module removal condition(s) can be any conditions that are required to be satisfied in order to effectuate the user's request for removal of the module indicated at 1706.

As one example, the module removal condition can require that the device be turned over or otherwise physically manipulated into a different position after the user input is received at 1706. Thus, in one example, in order to cause removal of a particular module, the user is required to turn the modular electronic device over after selecting the particular module from the module removal menu. For example, the modular electronic device (e.g., the frame) can include one or more inertial measurement units, gyroscopes, accelerometers, or other sensors that provide data regarding a position and/or orientation of the device. In the example discussed above, the frame controller can determine at 1708 whether the data from the sensors indicates that the device has been rotated about its longitudinal axis by greater than some threshold amount of degrees (e.g., 90 degrees, 135 degrees, or 180 degrees).

As another example, the module removal condition can require that the device be positioned so that the rear side of the device is facing substantially away from the direction of gravity. Such may ensure that removal of the modules (e.g., by automatic ejection) does not result in the modules falling away from the device. In some implementations, the module removal conditions require that the device has been turned or rotated so that the rear side of the device is facing "up," or away from the direction of gravity (e.g., a combination of the two above-discussed conditions).

In other implementations, the module removal condition may simply require continued satisfaction of the removal menu display condition (e.g., continued depression or selection of the button on the side of the frame).

If the frame controller determines at 1708 that the module removal condition(s) are met, then at 1710, the frame controller enables removal of the selected electronic module. For example, at 1710 the frame controller can control one or more latch mechanisms to allow removal of the selected electronic module.

In some implementations, enabling removal of the selected electronic module at 1710 can include preparing the module for removal. Preparing the module for removal can include storing, by the frame controller, at a non-volatile computer-readable medium one or more items of data associated with the selected electronic module and previously stored in a volatile computer-readable medium; and eliminating, by the frame controller, a flow of power from a power source of the modular electronic device to the selected electronic module. The non-volatile computer-readable medium can be included in the frame or in the selected electronic module.

As another example, in some implementations, enabling removal of the identified electronic module at 1710 can include causing, by the frame controller, physical ejection of the selected electronic module from the corresponding bay. For example, in some implementations, causing physical ejection of the selected electronic module can include controlling, by the frame controller, a latch of the corresponding bay to result in physical ejection of the electronic module. In particular, as an example, the frame and/or module can include a biasing member or other ejector that continuously provides repulsive forces between the module and the frame. Therefore, when the latch is controlled to unsecure the module from the bay, the repulsive forces can cause physical ejection of at least a portion of the module. In other implementations, the biasing member can be controllable to provide the repulsive forces when ejection is desired.

However, referring again to 1708, if the frame controller determines that one or more of the module removal condition(s) are not met, then method 1700 can proceed to 1712. At 1712, the frame controller causes the display of instructions on how to satisfy the module removal conditions. For example, the frame controller can cause the primary display to display textual instructions such as "turn the device over to allow the module to release" or other similar textual or graphical instructions. After 1712, method 1700 can return to 1708 and determine if the module removal condition(s) are met. Other operations can be performed as well, such as cancelling or timing out the removal request if the condition(s) are not met.

While aspects of the present disclosure are discussed with reference to activation of an electronic module in response to a user touch of such module, the present disclosure is equally applicable to deactivation of an electronic module in response to a user touch of such module. For example, if an electronic module is currently operating, a user touch of such module can result in ceasing operation of such module. More elaborate controls (e.g., volume control, brightness control, camera frame rate, etc.) of an electronic module as a result of touch of such module are available in some implementations of the present disclosure, as well.

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein may be implemented using a single device or component or multiple devices or components working in combination. Databases and applications may be implemented on a single system or distributed across multiple systems. Distributed components may operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, may readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

In particular, although FIGS. 5, 6, 14, and 17 respectively depict steps performed in a particular order for purposes of illustration and discussion, the methods of the present disclosure are not limited to the particularly illustrated order or arrangement. The various steps of the methods 500, 600, 1400, and 1700 can be omitted, rearranged, combined, and/or adapted in various ways without deviating from the scope of the present disclosure.

What is claimed is:

1. A modular electronic device, comprising:
   a plurality of electronic modules;
   at least one input sensor that provides data indicative of a location of a touch of the modular electronic device by a user; and
   a frame adapted to respectively receive the plurality of electronic modules, each of the plurality of electronic modules selectively removable from the frame, the frame comprising:
      a frame controller; and
      at least one data connection interface that communicatively couples the plurality of electronic modules to the frame controller;
   wherein the frame controller:
      receives the data indicative of the location of the touch of the modular electronic device from the at least one input sensor; and
      in response to the touch:
         identifies, based at least in part on the data received from the at least one input sensor, which of the plurality of electronic modules corresponds to the location of the touch of the modular electronic device by the user; and
         enables removal of the identified electronic module from the frame.

2. The modular electronic device of claim 1, wherein:
   at least one of the frame and the plurality of electronic modules further comprise a plurality of latches, each of the plurality of latches controllable by the frame controller to selectively secure the respective electronic module to the frame; and
   the frame controller controls the corresponding latch in the identified electronic module or the frame to enable removal of the identified electronic module from the frame.

3. The modular electronic device of claim 2, wherein:
   each of the plurality of latches is controllable by the frame controller to selectively result in physical ejection of the respective electronic module from the frame; and
   the frame controller controls the corresponding latch to cause physical ejection the identified electronic module from the frame.

4. The modular electronic device of claim 2, wherein each of the plurality of latches comprises a hook that is controllably actuatable between a first position in which the hook securingly engages a counterpart and a second position in which the hook does not securingly engage the counterpart.

5. The modular electronic device of claim 1, wherein:
   in response to the touch, the frame controller further determines whether a secondary condition is satisfied at a time of the touch; and
   the frame controller enables removal of the identified electronic module from the frame only when the secondary condition is satisfied at the time of the touch.

6. The modular electronic device of claim 5, wherein a continuous user input is required for the secondary condition to be satisfied.

7. The modular electronic device of claim 5, wherein:
the frame further comprises a button; and
the secondary condition comprises a press and hold of the button.

8. The modular electronic device of claim 5, wherein:
the frame further comprises a switch that has at least one component that is selectively pullable away from the frame; and
the secondary condition comprises a pull of the at least one component of the switch away from the frame.

9. The modular electronic device of claim 5, wherein the secondary condition comprises a requirement that the device have a particular orientation when the touch occurs.

10. The modular electronic device of claim 1, wherein, in response to the touch, and prior to enabling removal of the identified electronic module from the frame, the frame controller:
stores at a non-volatile computer-readable medium one or more items of data associated with the identified electronic module and previously stored in a volatile computer-readable medium; and
eliminates a flow of power from a power source of the modular electronic device to the identified electronic module.

11. The modular electronic device of claim 1, wherein the at least one input sensor comprises a plurality of switches respectively included in the plurality of electronic modules, each of the plurality of switches actuatable by a press of the corresponding electronic module toward the frame.

12. The modular electronic device of claim 1, wherein the at least one input sensor comprises:
a plurality of switches included in the frame, each of the plurality of switches actuatable by a press of the electronic module received in the frame toward the frame.

13. The modular electronic device of claim 1, wherein the at least one input sensor comprises:
a plurality of capacitive sensors included in the frame, the frame operable to detect a change in capacitance at a respective one of the plurality of capacitive sensors due to the touch.

14. The modular electronic device of claim 1, wherein the at least one input sensor comprises:
a RADAR system that sends, receives, and processes radio waves to determine the location of the touch of the modular electronic device by the user.

15. The modular electronic device of claim 1, wherein the at least one input sensor comprises:
a computer vision system that processes imagery captured by a camera of the modular electronic device to determine the location of the touch of the modular electronic device by the user.

16. The modular electronic device of claim 1, wherein the at least one input sensor comprises:
an inertial system that analyzes a moment indicated by data from one or more gyroscopes or accelerometers of the modular electronic device to determine the location of the touch of the modular electronic device by the user.

17. The modular electronic device of claim 1, wherein each of the plurality of electronic modules has a footprint that is complementary to a size and a shape of a respective bay of the frame at which such electronic module is received.

18. The modular electronic device of claim 1, wherein:
the frame controller maintains a mapping that respectively maps the plurality of electronic modules to a plurality of bays of the frame in which they are respectively received; and
to identify which of electronic modules corresponds to the location of the touch, the frame controller:
identifies, based at least in part on the data received from the at least one input sensor, which of the plurality of bays corresponds to the location of the touch of the modular electronic device by the user; and
consults the mapping to identify the electronic module received at the identified bay.

19. The modular electronic device of claim 1, wherein the modular electronic device comprises a handheld device.

20. The modular electronic device of claim 1, wherein the identified module comprises a pulse monitor.

21. The modular electronic device of claim 1, wherein the identified module comprises an oxygen level monitor.

22. The modular electronic device of claim 1, wherein the identified module comprises a credit card reader.

23. The modular electronic device of claim 1, wherein the identified module comprises a camera.

24. The modular electronic device of claim 1, wherein the identified module comprises a microphone.

25. The modular electronic device of claim 1, herein the identified module comprises a speaker.

26. The modular electronic device of claim 1, wherein the identified module comprises a flashlight.

27. The modular electronic device of claim 1, wherein the identified module comprises a visual battery life indicator.

28. The modular electronic device of claim 1, wherein the identified module comprises a display.

29. The modular electronic device of claim 28, wherein the display comprises a rear-facing display.

30. The modular electronic device of claim 1, wherein the identified module comprises a wireless communications interface.

31. The modular electronic device of claim 1, wherein the identified module comprises a Wi-Fi interface module.

32. The modular electronic device of claim 1, wherein the identified module comprises a cellular data module.

33. The modular electronic device of claim 1, wherein the identified module comprises a short-range wireless radio module.

34. The modular electronic device of claim 1, wherein the identified module comprises a battery module.

35. The modular electronic device of claim 1, wherein the identified module comprises a USB interface module.

36. The modular electronic device of claim 1, wherein the identified module comprises a diversity antenna module.

37. The modular electronic device of claim 1, wherein the touch of the modular electronic device by the user comprises a physical touch of the identified electronic module by the user.

38. The modular electronic device of claim 1, wherein the touch of the modular electronic device by the user comprises a touch of a display screen that is displaying an interactive module removal graphic that depicts at least some of the plurality of electronic modules, and wherein the input sensor comprises the display screen.

39. The modular electronic device of claim 1, wherein to enable removal of the identified module, the frame physically ejects the identified module.

40. The modular electronic device of claim 39, wherein the frame comprises an ejector that is controllable to physically eject the identified module.

41. The modular electronic device of claim 39, wherein the frame comprises an ejector that continuously applies repulsive forces to the identified module such that the identified module is physically ejected once a latch associated with the identified module is disengaged from the identified module.

42. A method of operating a modular electronic device that includes a plurality of electronic modules and a frame, the frame adapted to respectively receive the plurality of electronic modules, each of the plurality of electronic modules selectively removable from the frame, the method comprising:

receiving, by the modular electronic device, data from at least one input sensor of the modular electronic device, the data indicative of a location of a touch of the modular electronic device by a user; and in response to the touch:

identifying, by the modular electronic device based at least in part on the data received from the at least one input sensor, which of the plurality of electronic modules corresponds to the location of the touch of the modular electronic device by the user; and enabling, by the modular electronic device, removal of the identified electronic module from the frame.

\* \* \* \* \*